US011949046B2

United States Patent
Kim et al.

(10) Patent No.: US 11,949,046 B2
(45) Date of Patent: Apr. 2, 2024

(54) LIGHT-EMITTING ELEMENT, METHOD OF FABRICATING THE LIGHT-EMITTING ELEMENT, AND DISPLAY DEVICE

(71) Applicant: Samsung Display Co., LTD., Yongin-si (KR)

(72) Inventors: Se Hun Kim, Yongin-si (KR); Chang Hee Lee, Seoul (KR); Yun Hyuk Ko, Asan-si (KR); Duk Ki Kim, Suwon-si (KR); Jun Woo Park, Hwaseong-si (KR); Soo Ho Lee, Hwaseong-si (KR); Jae Kook Ha, Seoul (KR); Yun Ku Jung, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 314 days.

(21) Appl. No.: 17/395,950

(22) Filed: Aug. 6, 2021

(65) Prior Publication Data
US 2022/0052227 A1    Feb. 17, 2022

(30) Foreign Application Priority Data

Aug. 13, 2020    (KR) ........................ 10-2020-0101684

(51) Int. Cl.
*H01L 33/00* (2010.01)
*H01L 25/16* (2023.01)
(Continued)

(52) U.S. Cl.
CPC ............ *H01L 33/44* (2013.01); *H01L 25/167* (2013.01); *H01L 33/0095* (2013.01);
(Continued)

(58) Field of Classification Search
None
See application file for complete search history.

(56) References Cited

U.S. PATENT DOCUMENTS

2008/0157057 A1    7/2008   Kim
2013/0105836 A1*   5/2013   Yokozeki ................ H01L 33/02
                                                          257/E33.014
(Continued)

FOREIGN PATENT DOCUMENTS

EP          3 840 064      6/2021
KR      10-2014-0109377    9/2014
(Continued)

OTHER PUBLICATIONS

Extended European search report for European Patent Application or Patent No. 21190870.2 dated Jan. 11, 2022.

*Primary Examiner* — Bradley Smith
(74) *Attorney, Agent, or Firm* — KILE PARK REED & HOUTTEMAN PLLC

(57) ABSTRACT

A light-emitting element includes a first semiconductor layer doped to have a first polarity, a second semiconductor layer doped to have a second polarity different from the first polarity, a light-emitting layer disposed between the first and second semiconductor layers, a shell layer formed on side surfaces of the first semiconductor layer, the light-emitting layer, and the second semiconductor layer, the shell layer including a divalent metal element, and an insulating film covering an outer surface of the shell layer and surrounding the side surface of the light-emitting layer.

18 Claims, 24 Drawing Sheets

(51) Int. Cl.
*H01L 33/44* (2010.01)
*H01L 33/20* (2010.01)
(52) U.S. Cl.
CPC ........ *H01L 33/007* (2013.01); *H01L 33/0093* (2020.05); *H01L 33/20* (2013.01); *H01L 2933/0025* (2013.01)

(56) References Cited

U.S. PATENT DOCUMENTS

2014/0145237 A1* 5/2014 Do .................... H01L 33/44
                                                438/34
2017/0158954 A1   6/2017 Yang et al.
2017/0358563 A1* 12/2017 Cho .................... H01L 33/38
2021/0167050 A1   6/2021 Cho et al.

FOREIGN PATENT DOCUMENTS

| KR | 10-1542504     | 8/2015  |
| KR | 10-1672781     | 11/2016 |
| KR | 10-2020-0019809 | 2/2020  |
| KR | 10-2020-0021014 | 2/2020  |
| KR | 10-2020-0027136 | 3/2020  |
| WO | 2016/080709    | 5/2016  |
| WO | 2017/112490    | 6/2017  |
| WO | 2020/036271    | 2/2020  |

* cited by examiner

LIGHT-EMITTING ELEMENT, METHOD OF FABRICATING THE LIGHT-EMITTING ELEMENT, AND DISPLAY DEVICE

CROSS-REFERENCE TO RELATED APPLICATION(S)

This application claims priority to and the benefit of Korean Patent Application No. 10-2020-0101684 under 35 U.S.C. § 119, filed in the Korean Intellectual Property Office (KIPO) on Aug. 13, 2020, the entire contents of which are incorporated herein by reference.

BACKGROUND

1. Technical Field

The disclosure relates to a light-emitting element, a method of fabricating the light-emitting element, and a display device.

2. Description of the Related Art

Display devices are becoming increasingly important with the development of multimedia. Accordingly, various types of display devices such as organic light-emitting displays and liquid crystal displays are being used.

A display device is a device for displaying an image and includes a display panel such as an organic light-emitting display panel or a liquid crystal display panel. As a light-emitting display panel, the display panel may include light-emitting elements such as light-emitting diodes (LEDs). For example, the LEDs may be organic light-emitting diodes (OLEDs) using an organic material as a fluorescent material or may be inorganic LEDs using an inorganic material as the fluorescent material.

SUMMARY

Embodiments of the disclosure provide a light-emitting element including semiconductor layers and a shell layer formed on the outer surfaces of the semiconductor layers and thereby having any defects in the semiconductor layers compensated for and a method of fabricating the light-emitting element.

Embodiments of the disclosure also provide a display device including the light-emitting element and thereby having an improved emission efficiency.

However, embodiments of the disclosure are not restricted to those set forth herein. The above and other embodiments of the disclosure will become more apparent to one of ordinary skill in the art to which the disclosure pertains by referencing the detailed description of the disclosure given below.

According to an embodiment of the disclosure, a light-emitting element may comprise a first semiconductor layer doped to have a first polarity, a second semiconductor layer doped to have a second polarity different from the first polarity, a light-emitting layer disposed between the first and second semiconductor layers, a shell layer formed on a side surface of the first semiconductor layer, a side surface of the light-emitting layer, and a side surface of the second semiconductor layer, the shell layer including a divalent metal element, and an insulating film covering an outer surface of the shell layer and surrounding the side surface of the light-emitting layer.

The light-emitting element may further comprise an electrode layer disposed on the second semiconductor layer, wherein the insulating film may surround the light-emitting layer, the second semiconductor layer, and at least part of the outer surface of the electrode layer.

The shell layer may be disposed directly on the side surfaces of the first semiconductor layer, the light-emitting layer, and the second semiconductor layer to form a physical interface with at least the first semiconductor layer.

The shell layer may include at least one of ZnS, ZnSe, MgS, MgSe, ZnMgS, and ZnMgSe.

The shell layer may have a thickness of about 0.5 nm to about 10 nm.

The shell layer may form a region doped with the divalent metal element, on the side surfaces of the first semiconductor layer, the light-emitting layer, and the second semiconductor layer.

The divalent metal element may be one of Be, Mg, Ca, Sr, Ba, Zn, and Cd.

The shell layer may be doped with an amount of the divalent metal element in a range of about $10^{10}/cm^3$ to about $10^{18}/cm^3$.

The shell layer may have a thickness in a range of about 0.1 Å to about 50 Å.

The insulating film may be formed as a single layer or multilayer including one of silicon oxide, silicon nitride, silicon oxynitride, aluminum nitride, aluminum oxide, titanium oxide, zirconium oxide, and hafnium oxide and have a thickness in a range of about 10 nm to about 200 nm.

The insulating film may include a first layer which is disposed directly on the shell layer, and a second layer which is disposed directly on the first layer, the first layer may include silicon oxide, and the second layer may include of aluminum oxide.

The light-emitting element may further comprise a third semiconductor layer disposed between the first semiconductor layer and the light-emitting layer, a fourth semiconductor layer disposed between the second semiconductor layer and the light-emitting layer, and a fifth semiconductor layer disposed between the second and fourth semiconductor layers, wherein the shell layer may be formed on side surfaces of the third, fourth, and fifth semiconductor layers.

According to an embodiment of the disclosure, a method of fabricating a light-emitting element may comprise forming a plurality of element rods on a target substrate to be spaced apart from each other, forming shell layers that include a divalent metal element, on a part of outer surfaces of the plurality of element rods and forming insulating films on the shell layers, and separating the plurality of element rods with the insulating films formed thereon from the target substrate.

The forming of the plurality of element rods may comprise forming a semiconductor structure by forming a plurality of semiconductor layers on the target substrate, and etching the semiconductor structure in a direction perpendicular to a top surface of the target substrate.

The forming of the shell layers and the insulating films may comprise forming a shell material layer which surrounds the plurality of element rods, by immersing the target substrate with the plurality of element rods formed thereon in a solution in which a precursor material for forming the shell layers is mixed, forming an insulating layer on the shell material layer, and forming the shell layers and the insulating films by partially removing the shell material layer and the insulating layer to expose top surfaces of the plurality of element rods.

The forming of the plurality of element rods may include forming the plurality of element rods, each of the plurality of element rods including a first semiconductor layer which is doped to have a first polarity, a second semiconductor layer which is doped to have a second polarity different from the first polarity, and a light-emitting layer which is disposed between the first semiconductor layers and the second semiconductor layers, and the forming of the shell layers may include forming a shell layer on a side surface of the first semiconductor layer, a side surface of the light-emitting layer, and a side surface of the second semiconductor layer.

According to an embodiment of the disclosure, a display device may comprise a first substrate, a first electrode disposed on the first substrate, a second electrode spaced apart from the first electrode, a first insulating layer disposed on the first substrate and overlapping parts of the first and second electrodes, and a plurality of light-emitting elements disposed on the first insulating layer, each of the plurality of light-emitting elements including a first end portion disposed on the first electrode and a second end portion disposed on the second electrode, wherein each of the plurality of light-emitting elements may include a first semiconductor layer which is doped to have a first polarity, a second semiconductor layer which is doped to have a second polarity different from the first polarity, a light-emitting layer, which is disposed between the first and second semiconductor layers, a shell layer, which is formed on a side surface of the first semiconductor layer, a side surface of the light-emitting layer, and a side surface of the second semiconductor layer, the shell layer including a divalent metal element, and an insulating film which is disposed to cover an outer surface of the shell layer and to surround at least the side surface of the light-emitting layer.

The display device may further comprise a first contact electrode electrically contacting the first electrode and the first end portion of each of the plurality of light-emitting elements, and a second contact electrode electrically contacting the second electrode and the second end portion of each of the plurality of light-emitting elements.

The shell layer may be disposed directly on the side surface of the first semiconductor layer, the side surface of the light-emitting layer, and the side surface of the second semiconductor layer to form a physical interface with at least the first semiconductor layer, and the shell layer may include at least one of ZnS, ZnSe, MgS, MgSe, ZnMgS, and ZnMgSe.

The shell layer may form a region doped with the divalent metal element, on the side surface of the first semiconductor layer, the side surface of the light-emitting layer, and the side surface of the second semiconductor layer.

According to the aforementioned and other embodiments of the disclosure, a light-emitting element including a shell layer for compensating for any defects in semiconductor layers is provided, and thus, emission efficiency may be prevented from being lowered by such defects.

A display device including the light-emitting element is provided, and thus, the emission efficiency per unit area may be improved.

Other features and embodiments may be apparent from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which some embodiments of the disclosure are shown. This disclosure may, however, be embodied in different forms and should not be construed as being limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Embodiments of the disclosure will hereinafter be described with reference to the accompanying drawings.

Figure 1:
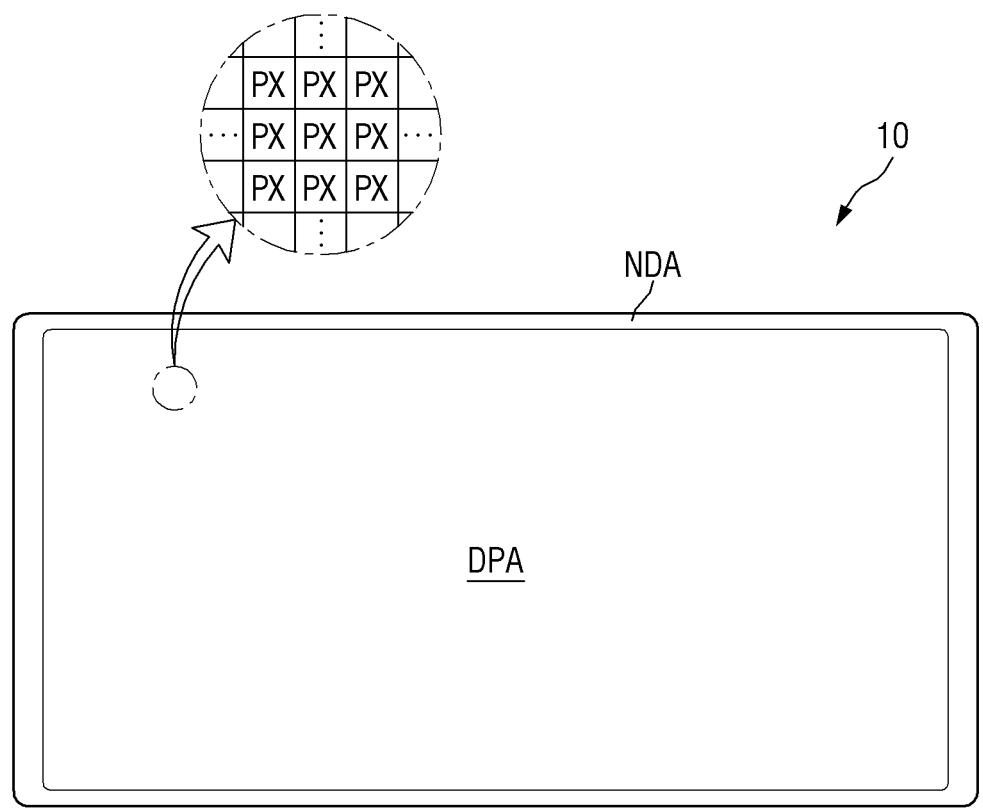
FIG. 1 is a schematic plan view of a display device according to an embodiment of the disclosure.

FIG. 1 is a schematic plan view of a display device according to an embodiment.

Referring to FIG. 1, a display device 10 may display a moving or still image. The display device 10 may refer to all types of electronic devices that provide a display screen. Examples of the display device 10 may include a television (TV), a laptop computer, a monitor, a billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book (e-book), a portable multimedia player (PMP), a navigation device, a gaming console, a digital camera, a camcorder, or the like.

The display device 10 may include a display panel that provides a display screen. Examples of the display panel of the display device 10 may include an inorganic light-emitting diode (ILED) display panel, an organic light-emitting diode (OLED) display panel, a quantum-dot light-emitting diode (QLED) display panel, a plasma display panel (PDP), a field-emission display (FED) panel, or the like. The display panel of the display device 10 will hereinafter be described as being, for example, an ILED display panel, but the disclosure is not limited thereto. For example, the disclosure may be applicable to various other display panels as long as the same technical idea may be applicable.

The shape of the display device 10 may vary. For example, the display device 10 may have a rectangular shape extending longer in a horizontal direction than in a vertical direction, a rectangular shape extending longer in the vertical direction than in the horizontal direction, a square shape, a tetragonal shape with rounded corners, a non-tetragonal polygonal shape, or a circular shape. The shape of a display area DPA of the display device 10 may be similar to the shape of the display device 10. FIG. 1 illustrates that the display device 10 and the display area DPA have a rectangular shape extending longer in the horizontal direction than in the vertical direction.

The display device 10 may include the display area DPA and a non-display area NDA. The display area DPA may be an area in which a screen is displayed, and the non-display area NDA may be an area in which a screen is not displayed. The display area DPA may also be referred to as an active area, and the non-display area NDA may also be referred to as an inactive area. The display area DPA may occupy the middle part of the display device 10.

The display area DPA may include pixels PX. The pixels PX may be arranged in row and column directions. The pixels PX may have a rectangular or square shape in a plan view, but the disclosure is not limited thereto. As another example, the pixels PX may have a rhombic shape having sides that are inclined with respect to a particular direction. The pixels PX may be alternately arranged in a stripe fashion or a PenTile® fashion. Each of the pixels PX may include one or more light-emitting elements 30, which emit light of a particular wavelength range.

The non-display area NDA may be disposed around the display area DPA. The non-display area NDA may surround the entire display area DPA or part of the display area DPA. The display area DPA may have a rectangular shape, and the non-display area NDA may be disposed adjacent to four sides of the display area DPA. The non-display area NDA may form the bezel of the display device 10. Wires or circuit drivers included in the display device 10 may be disposed in the non-display area NDA, or external devices may be mounted in the non-display area NDA.

Figure 2:
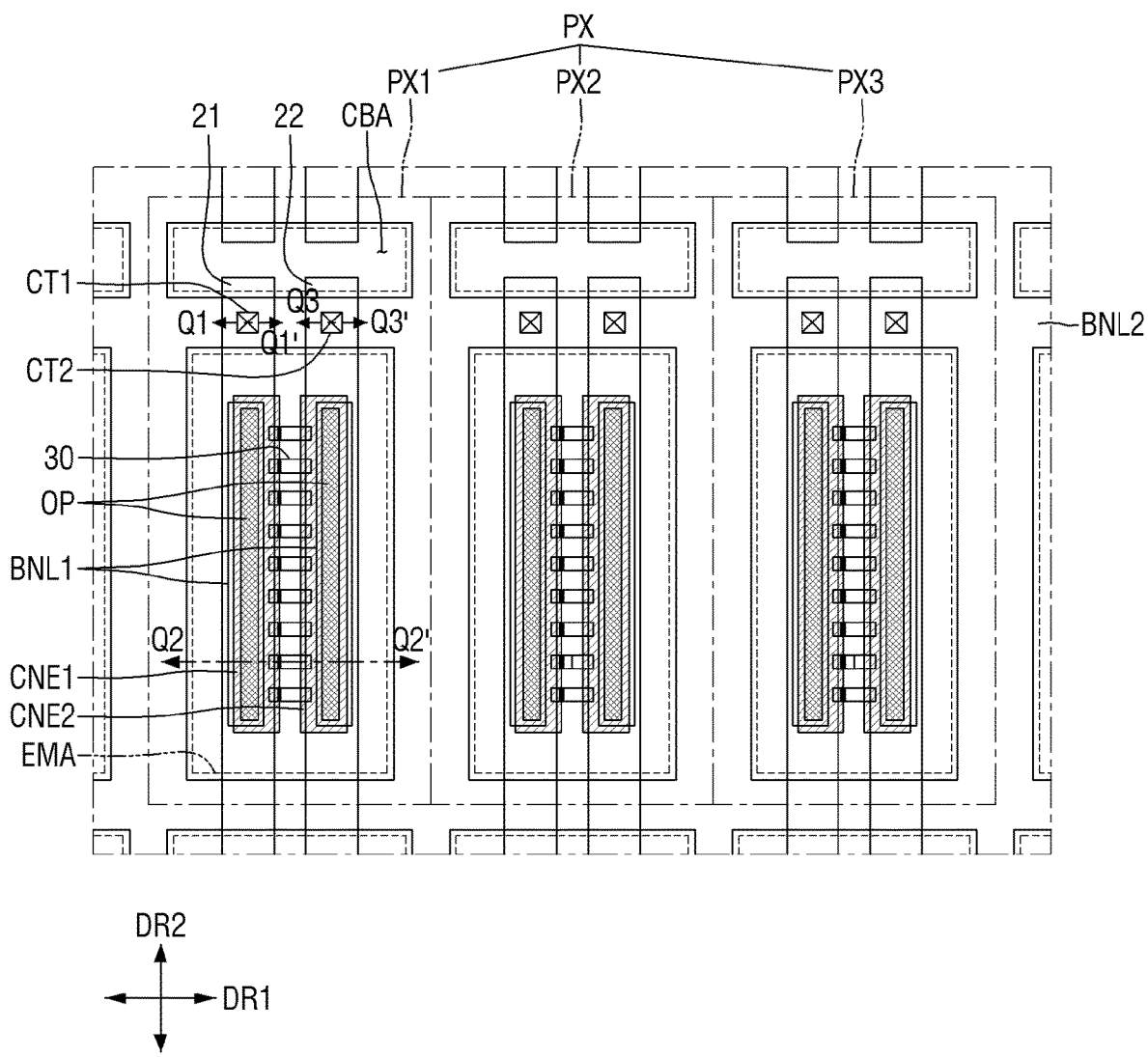
FIG. 2 is a schematic plan view of a pixel of the display device of FIG. 1.

FIG. 2 is a schematic plan view of a pixel of the display device of FIG. 1.

Referring to FIG. 2, a pixel PX may include subpixels PXn (where n is an integer in a range of 1 to 3). For example, the pixel PX may include first, second, and third subpixels PX1, PX2, and PX3. The first, second, and third subpixels PX1, PX2, and PX3 may emit light of first, second, and third colors, respectively. For example, the first, second, and third colors may be blue, green, and red, respectively, but the disclosure is not limited thereto. As another example, the first, second, and third subpixels PX1, PX2, and PX3 may emit light of the same color. FIG. 2 illustrates that the pixel PX includes three subpixels PXn, but the disclosure is not limited thereto. For example, the pixel PX may include more than three subpixels PXn.

Each of the subpixels PXn may include an emission area EMA and a non-emission area. The emission area EMA may be an area in which light-emitting elements 30 are disposed and emit light of a particular wavelength range, and the non-emission area may be an area in which the light-emitting elements 30 are not disposed and from which no light is output because light emitted from the light-emitting elements 30 does not reach the area. The emission area EMA may include regions where the light-emitting elements 30 are disposed and regions which are adjacent to or around the light-emitting elements 30 and from which light emitted by the light-emitting elements 30 is output.

However, the disclosure is not limited thereto. As another example, the emission area EMA may also include regions from which light is output after it is emitted by the light-emitting elements 30 and then is reflected or refracted by other members. Light-emitting elements 30 may be disposed in each of the subpixels PX and may include the regions in which the light-emitting elements 30 are disposed and the regions adjacent thereto to form the emission area EMA.

Each of the subpixels PXn may further include a cut area CBA, which is disposed in the non-emission area. The cut area CBA may be disposed on a side of the emission area EMA in a second direction DR2. The cut area CBA may be disposed between emission areas EMA of two subpixels PXn adjacent to each other in the second direction DR2. For example, emission areas EMA and cut areas CBA may be arranged in the display area DPA of the display device 10. For example, emission areas EMA may be arranged in rows in a first direction DR1 and cut areas CBA may be arranged in rows in a first direction DR1, and the emission areas EMA and the cut areas CBA may be alternately arranged in the second direction DR2. The distance between the cut areas CBA in the first direction DR1 may be smaller than the distance between the emission areas EMA in the first direction DR1. A second bank BNL2 may be disposed between the cut areas CBA and the emission areas EMA, and the distances between the cut areas CBA, between the emission areas EMA, and between the cut areas CBA and the emission areas EMA may vary depending on the width of the second bank BNL2. As light-emitting elements 30 are not disposed in the cut areas CBA, no light may be output from the cut areas CBA. Instead, parts of electrodes (21 and 22) may be disposed in the cut areas CBA. The electrodes (21 and 22) may be divided or separated from each other in the cut areas CBA.

Figure 3:
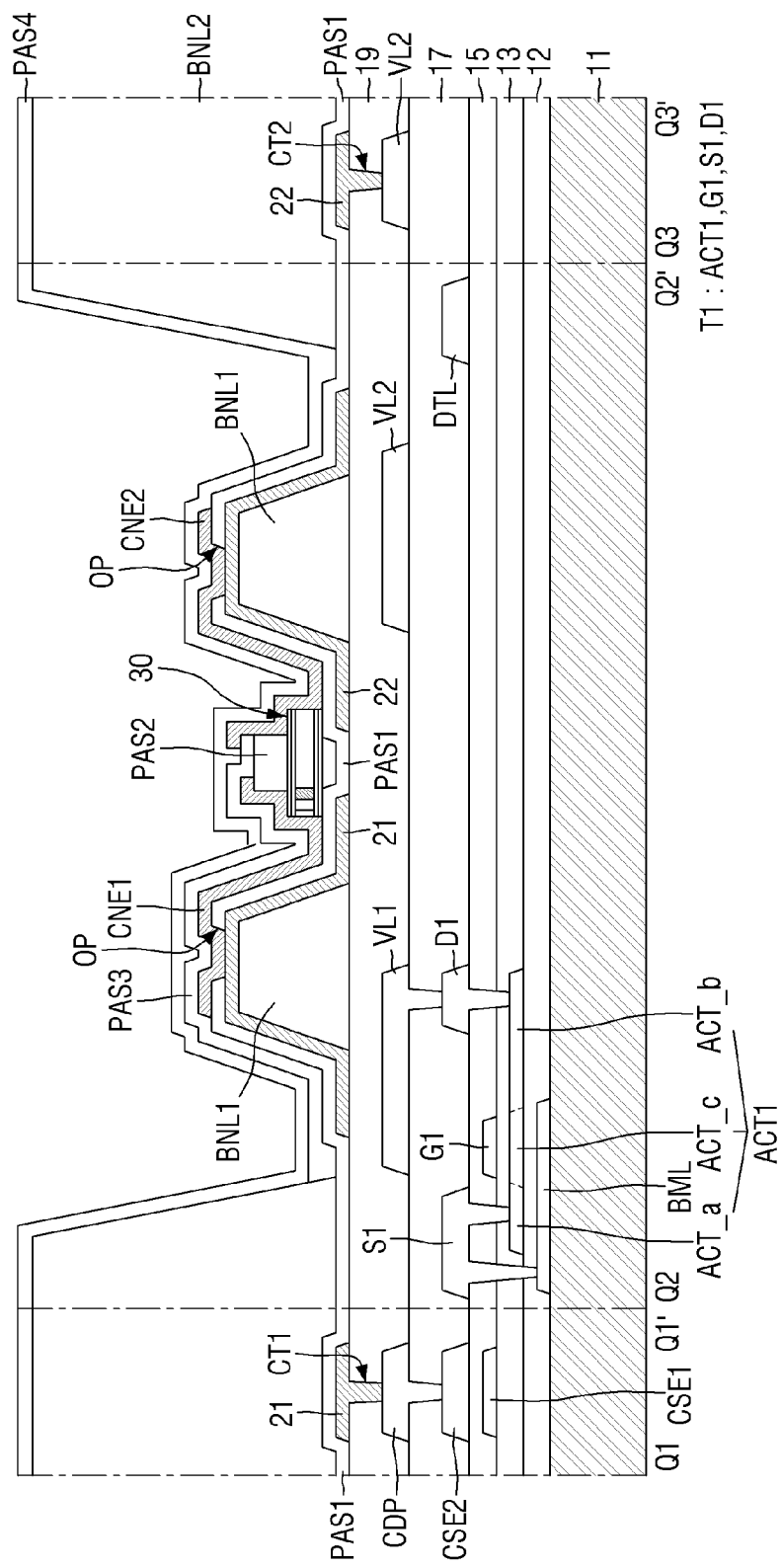
FIG. 3 is a schematic cross-sectional view taken along lines Q1-Q1', Q2-Q2', and Q3-Q3' of FIG. 2.

FIG. 3 is a schematic cross-sectional view taken along lines Q1-Q1', Q2-Q2', and Q3-Q3' of FIG. 2. FIG. 3 illustrates a schematic cross-sectional view taken from an end to another end (or the other end) of one of the light-emitting elements 30 in the first subpixel PX1 of FIG. 2.

Referring to FIG. 3 and further to FIG. 2, the display device 10 may include a first substrate 11 and a semiconductor layer, conductive layers, and insulating layers, which are disposed on the first substrate 11. The semiconductor layer, the conductive layers, and the insulating layers may form a circuit layer and a light-emitting layer of the display device 10.

The first substrate 11 may be an insulating substrate. The first substrate 11 may be formed of an insulating material such as glass, quartz, or a polymer resin. The first substrate 11 may be a rigid substrate or a flexible substrate that is bendable, foldable, or rollable.

A light-blocking layer BML may be disposed on the first substrate 11. The light-blocking layer BML is disposed to overlap an active layer ACT1 of a first transistor T1. The light-blocking layer BML may include a material capable of blocking light and may thus prevent light from being incident upon the active layer ACT1 of the first transistor T1. For example, the light-blocking layer BML may be formed of an opaque metallic material capable of blocking the transmission of light, but the disclosure is not limited thereto. In some embodiments, the light-blocking layer BML may not be provided.

A buffer layer 12 may be disposed on the entire surface of the first substrate 11. For example, the buffer layer 12 may be disposed to cover or overlap the top surfaces of the light-blocking layer BML, and the first substrate 11. The buffer layer 12 may be formed on the first substrate 11, which is susceptible to moisture, to protect the first transistor T1 from moisture and may perform a surface planarization function.

The active layer ACT1 may be disposed on the buffer layer 12. The active layer ACT1 may be disposed to overlap in part a gate electrode G1 of a first conductive layer that will be described below.

FIG. 3 illustrates only the first transistor T1 among other transistors included in the first subpixel PX1, but the disclosure is not limited thereto. The display device 10 may include more than a transistor in each of the subpixels PXn. For example, the display device 10 may include two or three transistors in each of the subpixels PXn in addition to the first transistor T1.

The active layer ACT1 may include polycrystalline silicon, monocrystalline silicon, or an oxide semiconductor. In a case where the active layer ACT1 includes an oxide semiconductor, the active layer ACT1 may include conductor regions and a channel region disposed between the conductor regions. The oxide semiconductor may be an oxide semiconductor containing indium (In). For example, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

As another example, the active layer ACT1 may include polycrystalline silicon, which may be formed by crystallizing amorphous silicon. In this case, the conductor regions of the active layer ACT1 may be regions doped with impurities.

A first gate insulating layer 13 may be disposed on the active layer ACT1 and the buffer layer 12. For example, the first gate insulating layer 13 may cover or overlap the entire surfaces of the active layer ACT1 and the buffer layer 12. The first gate insulating layer 13 may function as a gate insulating film for each transistor.

The first conductive layer may be disposed on the first gate insulating layer 13. The first conductive layer may include the gate electrode G1 of the first transistor T1 and a first capacitive electrode CSE1 of a storage capacitor. The gate electrode G1 may be disposed to overlap a channel region ACT_c of the active layer ACT1 in a thickness direction. The first capacitive electrode CSE1 may be disposed to overlap a second capacitive electrode CSE2, which will be described below, in the thickness direction. For example, the first capacitive electrode CSE1 may be integral with, and/or connected to, the gate electrode G1. The first and second capacitive electrodes CSE1 and CSE2 may be formed to overlap each other in the thickness direction, and a storage capacitor may be formed between the first and second capacitive electrodes CSE1 and CSE2.

A first interlayer insulating layer 15 may be disposed on the first conductive layer. The first interlayer insulating layer 15 may function as an insulating film between the first conductive layer and layers disposed on the first conductive layer. The first interlayer insulating layer 15 may be disposed to cover or overlap and protect the first conductive layer.

A second conductive layer may be disposed on the first interlayer insulating layer 15. A first data conductive layer may include a first source electrode S1 and a first drain electrode D1 of the first transistor T1, a data line DTL, and the second capacitive electrode CSE2.

The first source electrode S1 and the first drain electrode D1 of the first transistor T1 may contact doped regions ACT_a and ACT_b of the active layer ACT1 through contact holes that penetrate the first interlayer insulating layer 15 and the first gate insulating layer 13. The first source electrode S1 of the first transistor T1 may contact the light-blocking layer BML through another contact hole.

The data line DTL may apply a data signal to the other transistors included in the first subpixel PX1. Although not specifically illustrated, the data line DTL may be connected to the source/drain electrodes of other transistors and may transmit the data signal applied thereto.

The second capacitive electrode CSE2 is disposed to overlap the first capacitive electrode CSE1 in the thickness direction. For example, the second capacitive electrode CSE2 may be integral with, and/or connected to, the first source electrode S1.

A second interlayer insulating layer 17 may be disposed on the second conductive layer. The second interlayer insulating layer 17 may function as an insulating film between the second conductive layer and layers disposed on the second conductive layer. The second interlayer insulating layer 17 may overlap and protect the second conductive layer.

A third conductive layer may be disposed on the second interlayer insulating layer 17. The third conductive layer may include a first voltage line VL1, a second voltage line VL2, and a first conductive pattern CDP. A high-potential voltage (or a first power supply voltage) to be provided to the first transistor T1 may be applied to the first voltage line VL1, and a low-potential voltage (or a second power supply voltage) to be provided to a second electrode 22 may be applied to the second voltage line VL2. An alignment signal for aligning light-emitting elements 30 may be applied to the second voltage line VL2 during the fabrication of the display device 10.

The first conductive pattern CDP may be electrically connected to the second capacitive electrode CSE2 through a contact hole formed in the interlayer insulating layer 17. The second capacitive electrode CSE2 may be integral with the first source electrode S1 of the first transistor T1, and the first conductive pattern CDP may be electrically connected to the first transistor T1 of the first transistor T1. The first conductive pattern CDP may electrically contact the first electrode 21 that will be described below, and the first transistor T1 may transmit the first power supply voltage applied thereto from the first voltage line VL1 to the first electrode 21 via the first conductive pattern CDP. A second data conductive data layer is illustrated in FIG. 3 as including a first voltage line VL1 and a second voltage line VL2, but the disclosure is not limited thereto. As another example, the second data conductive layer may include more than one first voltage line VL1 and more than one second voltage line VL2.

Each of the buffer layer 12, the first gate insulating layer 13, the first interlayer insulating layer 15, and the second interlayer insulating layer 17 may include inorganic films alternately stacked. For example, each of the buffer layer 12, the first gate insulating layer 13, the first interlayer insulating layer 15, and the second interlayer insulating layer 17 may be formed as a double layer or a multilayer in which one or more inorganic layers including at least one of silicon oxide ($SiO_x$), silicon nitride ($SiN_x$), and silicon oxynitride ($SiO_xN_y$) are alternately stacked. As another example, each of the buffer layer 12, the first gate insulating layer 13, the first interlayer insulating layer 15, and the second interlayer insulating layer 17 may be formed as a single inorganic layer including at least one of silicon oxide, silicon nitride, and silicon oxynitride.

A first planarization layer 19 may be disposed on the second data conductive layer. The first planarization layer 19 may include an organic insulating material such as polyimide (PI) and may perform a surface planarization function.

First banks BNL1, electrodes (21 and 22), light-emitting elements 30, contact electrodes (CNE1 and CNE2), and a second bank BNL2 may be disposed on the first planarization layer 19. Insulating layers (PAS1, PAS2, PAS3, and PAS4) may also be disposed on the first planarization layer 19.

The first banks BNL1 may be disposed directly on the first planarization layer 19. Each of the first banks BNL1 may have a predetermined width in each subpixel PXn to extend in the second direction DR2 but may not extend to other subpixels PXn neighboring in the second direction DR2 and may be disposed within the emission area EMA. The first banks BNL1 may be disposed to be spaced apart from each other in the first direction DR1.

Multiple first banks BNL1 may be disposed in a subpixel PXn. FIG. 3 illustrates that two first banks BNL1 are disposed in each subpixel PXn to form linear patterns in the display area DPA, but the disclosure is not limited thereto. The number of first banks BNL1 disposed in a subpixel PXn may vary depending on the number of electrodes (21 and 22) disposed in the subpixel PXn and the arrangement of the light-emitting elements 30 in the subpixel PXn, and the first banks BNL1 may form island patterns, rather than linear patterns.

The first banks BNL1 may protrude at least in part from the top surface of the first planarization layer 19. Each of protruding parts of the first banks BNL1 may have inclined side surfaces, and light emitted from the light-emitting elements 30 may be reflected by the electrodes (21 and 22) disposed on the first banks BNL1 and may be emitted upward from the first planarization layer 19. The first banks BNL1 may provide an area in which the light-emitting elements 30 are arranged and may function as reflective walls upwardly reflecting light emitted from the light-emitting elements 30. The side surfaces of each of the first banks BNL1 may be linearly inclined, but the disclosure is not limited thereto. Each of the first banks BNL1 may have a semicircular or semielliptical shape with a curved outer surface. The first banks BNL1 may include an organic insulating material such as polyimide, but the disclosure is not limited thereto. In some embodiments, the first banks BNL1 may not be provided.

The electrodes (21 and 22) may be disposed in each subpixel PXn to extend in a direction. The electrodes (21 and 22) may extend in the second direction DR2 and may be disposed to be spaced apart from one another in the first direction DR1. For example, first and second electrodes 21 and 22 may be disposed in a subpixel PXn to be spaced apart from each other in the first direction DR1, but the disclosure is not limited thereto. For example, the number and the locations of the electrodes (21 and 22) disposed in each subpixel PXn may vary depending on the number of the electrodes (21 and 22) or the number of light-emitting elements 30 disposed in each subpixel PXn.

The first and second electrodes 21 and 22 may be disposed in the emission area EMA of each subpixel PXn and may be disposed in part beyond the emission area EMA to overlap the second bank BNL2 in the thickness direction. The electrodes (21 and 22) may extend in the second direction DR2 in the subpixel PXn and may be separated from electrodes (21 and 22) of the upper neighboring subpixel PXn in the second direction DR2 in the cut area CBA.

The first and second electrodes 21 and 22 may extend in the second direction DR2 in each subpixel PXn and may be separated from other first and second electrodes 21 and 22 in the cut area CBA. For example, a cut area CBA may be disposed between emission areas EMA of two adjacent subpixels PXn in the second direction DR2, and first and second electrodes 21 and 22 of one of the two adjacent subpixels PXn may be separated from first and second electrodes 21 and 22 of the other subpixel PXn in the cut area CBA. However, the disclosure is not limited to this example. As another example, some of the electrodes (21 and 22) may extend beyond each pair of adjacent subpixels PXn in the second direction DR2, instead of being divided between each pair of adjacent subpixels PXn in the second direction DR2, or only one of the first and second electrodes 21 and 22 may be divided between each pair of adjacent subpixels PXn in the second direction DR2.

The electrodes (21 and 22) may be obtained by forming electrode lines that extend in the second direction DR2 and by dividing the electrode lines after the arrangement of the light-emitting elements 30. The electrode lines may be used to form an electric field in the subpixel PXn to align the light-emitting elements 30 during the fabrication of the display device 10. For example, the light-emitting elements 30 may be sprayed onto the electrode lines by an inkjet printing process, and once ink including the light-emitting elements 30 is sprayed onto the electrode lines, an electric field may be formed by applying alignment signals to the electrode lines. The light-emitting elements 30 scattered or dispersed in the ink may receive a dielectrophoretic force from the electric field and may thus be arranged on the electrodes (21 and 22). After the arrangement of the light-emitting elements 30, some of the electrode lines may be divided to form electrodes (21 and 22) disposed in each of the subpixels PXn.

The electrodes (21 and 22) may be connected to the third conductive layer so that signals for causing the light-emitting elements 30 to emit light may be applied to the electrodes (21 and 22). The first electrode 21 may electrically contact the first conductive pattern CDP through a first contact hole CT1, which penetrates the first planarization layer 19. The second electrode 22 may electrically contact the second voltage line VL2 through a second contact hole CT2, which penetrates the first planarization layer 19. The first electrode 21 may be electrically connected to the first transistor T1 via the first conductive pattern CDP so that the first power supply voltage may be applied to the first electrode 21, and the second electrode 22 may be electrically connected to the second voltage line VL2 so that the second power supply voltage may be applied to the second electrode 22.

The electrodes (21 and 22) may be electrically connected to the light-emitting elements 30. The electrodes (21 and 22) may be connected to end portions of each of the light-emitting elements 30 through the contact electrodes (CNE1 and CNE2) and may transmit electrical signals received from the third conductive layer to the light-emitting elements 30. Since the electrodes (21 and 22) are divided between different subpixels PXn, light-emitting elements 30 of one subpixel PXn may emit light separately from light-emitting elements 30 of another subpixel PXn.

The first and second contact holes CT1 and CT2 are illustrated as being formed at locations that overlap the second bank BNL2, but the disclosure is not limited thereto. For example, the first and second contact holes CT1 and CT2 may be located in the emission area EMA surrounded by the second bank BNL2.

The electrodes (21 and 22) may be disposed on a pair of first banks BNL1 spaced apart from each other. The electrodes (21 and 22) may be disposed on sides of the first banks BNL1 in the first direction DR1 to be arranged on inclined side surfaces of the first banks BNL1. For example, the width of the electrodes (21 and 22) in the first direction DR1 may be smaller than that of the first banks BNL1 in the first direction DR1. The electrodes (21 and 22) may be disposed to overlap at least one side surface of each of the first banks BNL1 to reflect light emitted from the light-emitting elements 30.

The distance between the electrodes (21 and 22) in the first direction DR1 may be smaller than the distance between the first banks BNL1. At least parts of the electrodes (21 and 22) may be disposed directly on the first planarization layer 19 and may be disposed on the same plane (or layer).

The electrodes (21 and 22) may include a conductive material with high reflectance. For example, the electrodes (21 and 22) may include a metal with high reflectance such as silver (Ag), Cu, or Al or may include an alloy of Al, Ni, or lanthanum (La). The electrodes (21 and 22) may reflect light, emitted from the light-emitting elements 30 and travelling toward the sides of the first banks BNL1, upward from each subpixel PXn.

However, the disclosure is not limited thereto, and the electrodes (21 and 22) may further include a transparent conductive material. For example, the electrodes (21 and 22) may include a material such as ITO, IZO, or indium tin zinc oxide (ITZO). In some embodiments, each of the electrodes (21 and 22) may form a structure in which a transparent conductive material and a metal with high reflectance are stacked into more than one layer or may be formed as a single layer including a transparent conductive material and a metal with high reflectance. For example, each of the electrodes (21 and 22) may have a stack of ITO/Ag/ITO, ITO, ITO/Ag/IZO, or ITO/Ag/ITZO/IZO.

A first insulating layer PAS1 may be disposed on the electrodes (21 and 22) and the first banks BNL1. The first insulating layer PAS1 may be disposed to overlap the first banks BNL1 and the first and second electrodes 21 and 22 and may expose parts of the top surfaces of the first and second electrodes 21 and 22. Openings OP may be formed in the first insulating layer PAS1 to expose parts of the top surfaces of the electrodes (21 and 22) disposed on the first banks BNL1, and the contact electrodes (CNE1 and CNE2) may electrically contact the electrodes (21 and 22) through the openings OP.

For example, the first insulating layer PAS1 may be formed to have a recessed top surface between the first and second electrodes 21 and 22. As the first insulating layer PAS1 may be disposed to overlap the first and second electrodes 21 and 22, the first insulating layer PAS1 may be formed to be recessed between the first and second electrodes 21 and 22, but the disclosure is not limited thereto. The first insulating layer PAS1 may protect the first and second electrodes 21 and 22 and may insulate the first and second electrodes 21 and 22 from each other. The first insulating layer PAS1 may prevent the light-emitting elements 30 from being damaged by directly contacting other elements.

The second bank BNL2 may be disposed on the first insulating layer PAS1. In a plan view, the second bank BNL2 may include parts that extend in the first direction DR1 and parts that extend in the second direction DR2 and may thus be arranged in a lattice pattern. The second bank BNL2 may be disposed along the boundaries of each of the subpixels PXn to define each of the subpixels PXn. The second bank BNL2 may be disposed to surround the emission area EMA and the cut area CBA of each of the subpixels PXn to separate the emission area EMA from the cut area CBA of each of the subpixels PXn. Parts of the second bank BNL2 extending in the second direction DR2 between the emission areas EMA of the subpixels PXn may have a greater width than that of parts of the second bank BNL2 extending in the second direction DR2 between the cut areas CBA of the subpixels PXn. The distance between the cut areas CBA of the subpixels PXn may be smaller than the distance between the emission areas EMA of the subpixels PXn.

The second bank BNL2 may be formed to have a greater height than that of the first banks BNL1. The second bank BNL2 may prevent ink from spilling over between neighboring subpixels PXn in an inkjet printing process during the fabrication of the display device 10 and may separate ink having the light-emitting elements 30 dispersed therein between different subpixels PXn to prevent mixture of the ink. The second bank BNL2, like the first banks BNL1, may include polyimide, but the disclosure is not limited thereto.

The light-emitting elements 30 may be disposed on the first insulating layer PAS1. Light-emitting elements 30 may be disposed to be spaced apart from one another in the direction in which the electrodes (21 and 22) extend, for example, in the second direction DR2, and may be aligned substantially parallel to each other. The light-emitting elements 30 may extend in a direction, and the direction in which the electrodes (21 and 22) extend may form a substantially right angle with the direction in which the light-emitting elements 30 extend. However, the disclosure is not limited thereto. As another example, the light-emitting elements 30 may be arranged diagonally with respect to the direction in which the electrodes (21 and 22) extend.

Each of the light-emitting elements 30 may include semiconductor layers that are doped with a dopant(s) of different conductivity types. As each of the light-emitting elements 30 includes semiconductor layers, the light-emitting elements 30 may be aligned so that first end portions of each of the light-emitting elements 30 may face in a particular direction depending on the direction of an electric field formed on the electrodes (21 and 22). Each of the light-emitting elements 30 may include a light-emitting layer 36 (see FIG. 4) and may thus emit light of a particular wavelength range. The light-emitting elements 30 may emit light of different wavelength ranges depending on the material(s) thereof, but the disclosure is not limited thereto. As another example, the light-emitting elements 30 may emit light of the same color.

Layers may be arranged in each of the light-emitting elements 30, in a direction perpendicular to the top surface of the first substrate 11. The light-emitting elements 30 may be arranged such that a direction in which the light-emitting elements 30 extend may be parallel to the first substrate 11, and the semiconductor layers included in each of the light-emitting elements 30 may be sequentially arranged in a direction parallel to the top surface of the first substrate 11. However, the disclosure is not limited thereto. As another example, in case that the light-emitting elements 30 have different structures, the layers included in each of the light-emitting elements 30 may be arranged in a direction perpendicular to the first substrate 11.

The light-emitting elements 30 may be disposed on the electrodes (21 and 22), between the first banks BNL1. For example, the first end portions of the light-emitting elements 30 may be disposed on the first electrode 21, and the second end portions of the light-emitting elements 30 may be disposed on the second electrode 22. The length of the light-emitting elements 30 may be greater than the distance between the first and second electrodes 21 and 22, and both end portions of each of the light-emitting elements 30 may be disposed on the first and second electrodes 21 and 22, respectively.

Both end portions of each of the light-emitting elements 30 may electrically contact the contact electrodes (CNE1 and CNE2). As an insulating film 38 (see FIG. 6) may not be formed at both ends of each of the light-emitting elements 30 to expose parts of the semiconductor layers of each of the light-emitting elements 30, the exposed semiconductor layers may electrically contact the contact electrodes (CNE1 and CNE2), but the disclosure is not limited thereto. As another example, at least part of the insulating film 38 may be removed so that parts of side surfaces of the semiconductor layers of each of the light-emitting elements 30 may be exposed. The exposed side surfaces of the semiconductor layers may directly contact the contact electrodes (CNE1 and CNE2).

A second insulating layer PAS2 may be disposed in part on the first insulating layer PAS1 and the light-emitting elements 30. For example, the second insulating layer PAS2 may be disposed to surround parts of outer surfaces of the light-emitting elements 30 and may not cover the first end portions and the second end portions of the light-emitting elements 30. During the fabrication of the display device 10, the second insulating layer PAS2 may be initially disposed on the first insulating layer PAS1 (or the entire first insulating layer PAS1) and may then be partially removed to expose both end portions of each of the light-emitting elements 30.

Parts of the second insulating layer PAS2 disposed on the light-emitting elements 30 may extend in the second direction DR2, over the first insulating layer PAS1, and may thus form linear or island patterns in each subpixel PXn. The second insulating layer PAS2 may protect and fix the light-emitting elements 30 during the fabrication of the display device 10. The second insulating layer PAS2 may be disposed to fill the spaces between the light-emitting elements 30 and the first insulating layer PAS1.

Contact electrodes (CNE1 and CNE2) and a third insulating layer PAS3 may be disposed on the second insulating layer PAS2. First and second contact electrodes CNE1 and CNE2 may be disposed in part on the first and second electrodes 21 and 22, respectively. The first contact electrode CNE1 may be disposed on the first electrode 21, the second contact electrode CNE2 may be disposed on the second electrode 22, and the first and second contact electrodes CNE1 and CNE2 may extend in the second direction DR2. The first and second contact electrodes CNE1 and CNE2 may be spaced apart from, and face, each other in the first direction DR1 and may form linear patterns in the emission area EMA of each subpixel PXn.

The contact electrodes (CNE1 and CNE2) may electrically contact the light-emitting elements 30 and the electrodes (21 and 22). Each of the light-emitting elements 30 may have the semiconductor layers exposed at both ends thereof, and the first and second contact electrodes CNE1 and CNE2 may electrically contact the light-emitting elements 30 at both ends of each of the light-emitting elements 30 where the semiconductor layers of each of the light-emitting elements 30 are exposed. The first end portions of the light-emitting elements 30 may be electrically connected to the first electrode 21 via the first contact electrode CNE1, and the second end portions of the light-emitting elements 30 may be electrically connected to the second electrode 22 via the second contact electrode CNE2.

FIG. 3 illustrates that a first contact electrode CNE1 and a second contact electrode CNE2 are disposed in each of the subpixels PXn, but the disclosure is not limited thereto. For example, the numbers of first contact electrodes CNE1 and second contact electrodes CNE2 provided in each of the subpixels PXn may vary depending on the numbers of first electrodes 21 and second electrodes 22 provided in each of the subpixels PXn.

The contact electrodes (CNE1 and CNE2) may include a conductive material. For example, the contact electrodes (CNE1 and CNE2) may include ITO, IZO, ITZO, or aluminum (Al). For example, the contact electrodes (CNE1 and CNE2) may include a transparent conductive material, and light emitted from the light-emitting elements 30 may travel toward the electrodes (21 and 22) through the contact electrodes (CNE1 and CNE2). However, the disclosure is not limited to this example.

The third insulating layer PAS3 may be disposed between the first and second contact electrodes CNE1 and CNE2. The third insulating layer PAS3 may be disposed on the first contact electrode CNE1 and/or the second insulating layer PAS2, in regions other than a region where the second contact electrode CNE2 is disposed. The third insulating layer PAS3 may insulate the first and second contact electrodes CNE1 and CNE2 from each other so that the first and second contact electrodes CNE1 and CNE2 may not directly contact each other. For example, the first and second contact electrodes CNE1 and CNE2 may be disposed on different layers. The first contact electrode CNE1 may be disposed directly on the second insulating layer PAS2, and the second contact electrode CNE2 may be disposed in part directly on the third insulating layer PAS3.

The third insulating layer PAS3 may be disposed between the first and second contact electrodes CNE1 and CNE2 and may thus insulate the first and second contact electrodes CNE1 and CNE2 from each other. As mentioned above, in some embodiments, the third insulating layer PAS3 may not be provided, in which case, the first and second contact electrodes CNE1 and CNE2 may be disposed on the same layer.

A fourth insulating layer PAS4 may be disposed in the entire display area DPA of the first substrate 11. The fourth insulating layer PAS4 may protect the elements disposed on the first substrate 11 from an external environment. The fourth insulating layer PAS4 may not be provided.

The first, second, third, and fourth insulating layers PAS1, PAS2, PAS3, and PAS4 may include an inorganic insulating material or an organic insulating material. For example, the first, second, third, and fourth insulating layers PAS1, PAS2, PAS3, and PAS4 may include an inorganic insulating material such as silicon oxide ($SiO_x$), silicon nitride ($SiN_x$), silicon oxynitride ($SiO_xN_y$), aluminum oxide ($Al_2O_3$ (or $Al_xO_y$)), or aluminum nitride (AlN), but the disclosure is not limited thereto. In another example, the first, second, third, and fourth insulating layers PAS1, PAS2, PAS3, and PAS4 may include an organic insulating material such as an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin, but the disclosure is not limited thereto.

Figure 4:
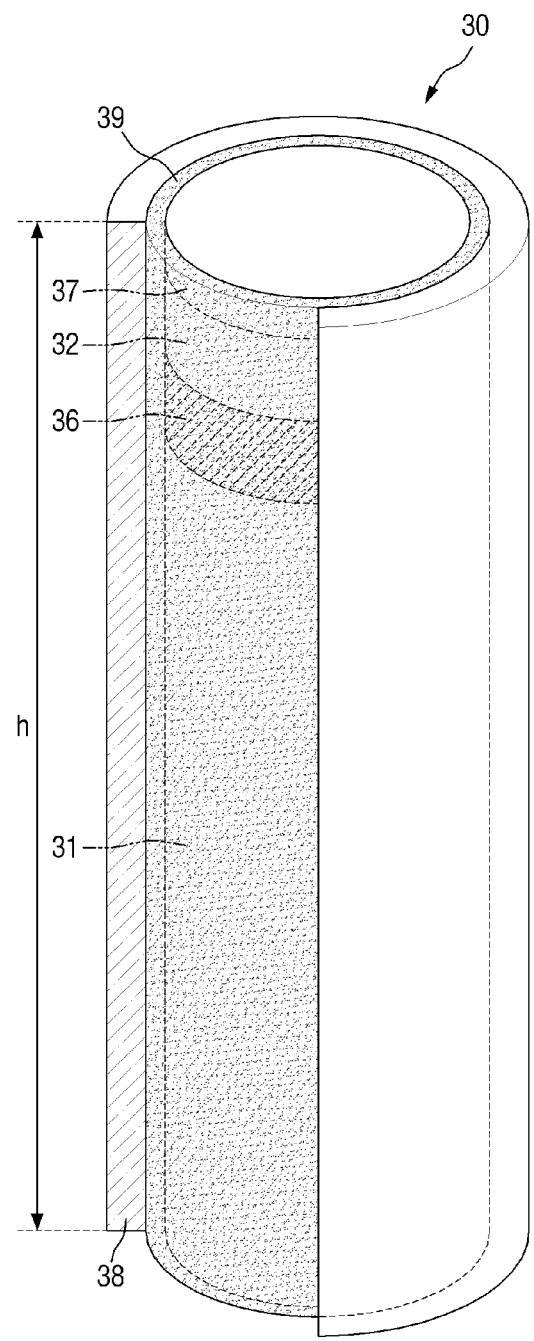
FIG. 4 is a schematic perspective view of a light-emitting element according to an embodiment of the disclosure.
Figure 5:
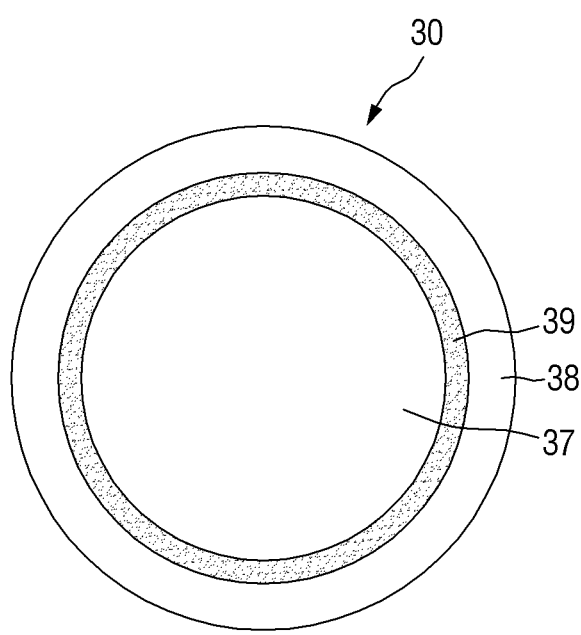
FIG. 5 is a schematic plan view of the light-emitting element of FIG. 4.
Figure 6:
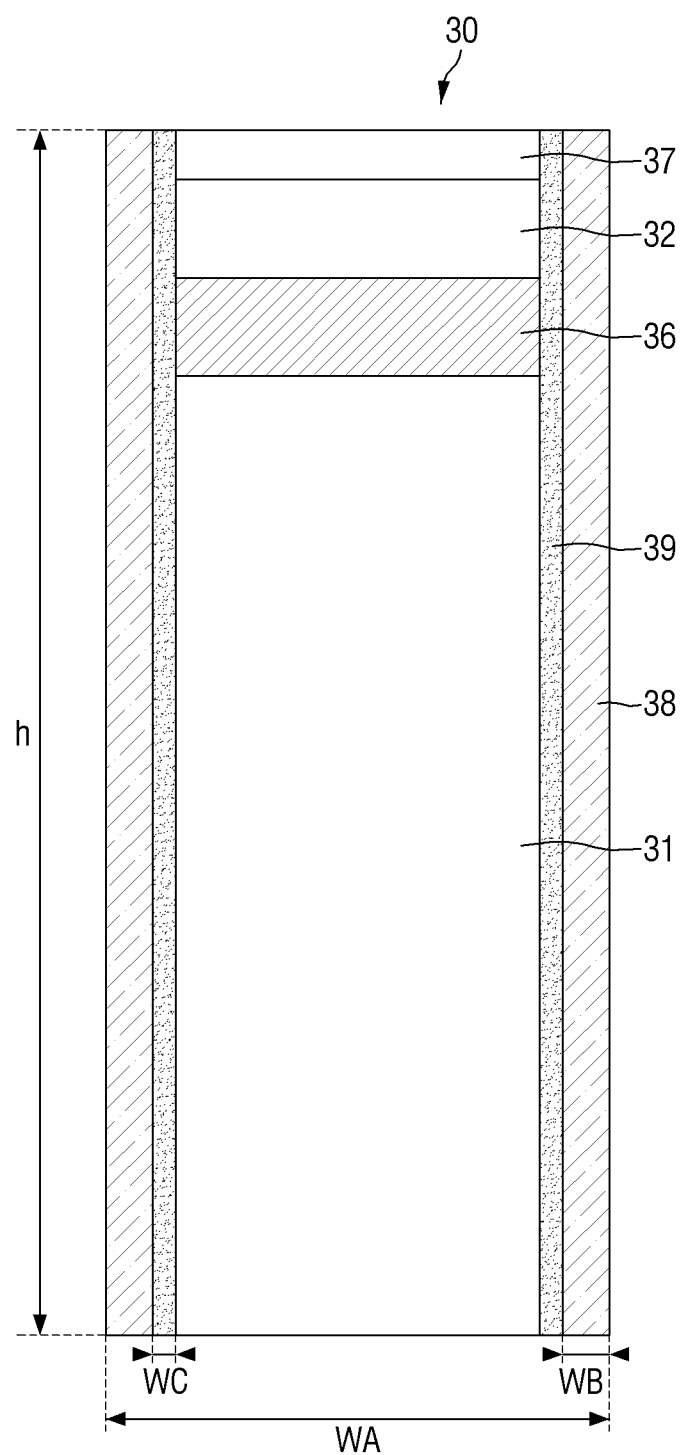
FIG. 6 is a schematic cross-sectional view of the light-emitting element of FIG. 4.

FIG. 4 is a schematic perspective view of a light-emitting element according to an embodiment. FIG. 5 is a schematic plan view of the light-emitting element of FIG. 4. FIG. 6 is a schematic cross-sectional view of the light-emitting element of FIG. 4. FIG. 4 illustrates a light-emitting element 30 including an insulating film 38, a part of which is removed to show semiconductor layers surrounded by the insulating film 38.

Referring to FIGS. 4 through 6, a light-emitting element 30 may be a light-emitting diode (LED), particularly, an ILED having a size of micrometers to nanometers and formed of an inorganic material. If an electric field is formed in a particular direction between two opposite electrodes, the ILED may be aligned between the two electrodes where polarities are formed. The light-emitting element 30 may be aligned by the electric field formed between the two electrodes.

The light-emitting element 30 may have a shape extending in a direction. The light-emitting element 30 may have the shape of a cylinder, a rod, a wire, or a tube, but the shape of the light-emitting element 30 is not particularly limited. As another example, the light-emitting element 30 may have the shape of a polygonal column such as a cube, a rectangular parallelepiped, or a hexagonal column or may have a shape extending in a direction and including a partially inclined outer surface. Semiconductors included in the light-emitting element 30 may be sequentially disposed or stacked in the direction in which the light-emitting element 30 extends.

The light-emitting element 30 may include semiconductor layers doped with impurities of an arbitrary conductivity type (e.g., a p-type or an n-type). The semiconductor layers may receive electrical signals from an external power source and emit light of a particular wavelength range.

Referring to FIGS. 4 through 6, the light-emitting element 30 may include a first semiconductor layer 31, a second semiconductor layer 32, the light-emitting layer 36, an electrode layer 37, the insulating film 38, and a shell layer 39.

The first semiconductor layer 31 may include an n-type semiconductor. In a case where the light-emitting element 30 emits light of a blue wavelength range, the first semiconductor layer 31 may include a semiconductor material $Al_xGa_yIn_{1-x-y}N$ (where $0 \le x \le 1$, $0 \le y \le 1$, and $0 \le x+y \le 1$). The semiconductor material $Al_xGa_yIn_{1-x-y}N$ may be at least one of AlGaInN, GaN, AlGaN, InGaN, AlN, and InN that are doped with an n-type dopant. The first semiconductor layer 31 may be doped with an n-type dopant, and the n-type dopant may be Si, Ge, or Sn. For example, the first semiconductor layer 31 may be n-GaN doped with n-type Si. The first semiconductor layer 31 may have a length of about 1.5 μm to about 5 μm, but the disclosure is not limited thereto.

The second semiconductor layer 32 may be disposed on the light-emitting layer 36. The second semiconductor layer 32 may include a p-type semiconductor. In a case where the light-emitting element 30 emits light of a blue or green wavelength range, the second semiconductor layer 32 may include a semiconductor material $Al_xGa_yIn_{1-x-y}N$ (where $0 \le x > 1$, $0 \le y \le 1$, and $0 \le x+y \le 1$). For example, the semiconductor material $Al_xGa_yIn_{1-x-y}N$ may be at least one of AlGaInN, GaN, AlGaN, InGaN, AlN, and InN that are doped with a p-type dopant. The second semiconductor layer 32 may be doped with a p-type dopant, and the p-type dopant may be Mg, Zn, Ca, Se, or Ba. For example, the second semiconductor layer 32 may be p-GaN doped with p-type Mg. The second semiconductor layer 32 may have a length of about 0.05 μm to about 0.10 μm, but the disclosure is not limited thereto.

FIGS. 4 through 6 illustrate that the first and second semiconductor layers 31 and 32 are formed as single layers, but the disclosure is not limited thereto. As another example, each of the first and second semiconductor layers 31 and 32 may include more than one layer such as a clad layer or a tensile strain barrier reducing (TSBR) layer, depending on the material of the light-emitting layer 36.

The light-emitting layer 36 may be disposed between the first and second semiconductor layers 31 and 32. The light-emitting layer 36 may include a material having a single quantum well structure or multi-quantum well structure. In a case where the light-emitting layer 36 includes a material having a multi-quantum well structure, the light-emitting layer 36 may have a structure in which multiple quantum layers and multiple well layers are alternately stacked. The light-emitting layer 36 may emit light by combining of electron-hole pairs in response to electrical signals applied thereto via the first and second semiconductor layers 31 and 32. In a case where the light-emitting layer 36 emits light of a blue wavelength range, the quantum layers may include a material such as AlGaN or AlGaInN. In a case where the light-emitting layer 36 has a multi-quantum well structure in which multiple quantum layers and multiple well layers are alternately stacked, the quantum layers may include a material such as AlGaN or AlGaInN, and the well layers may include a material such as GaN or AlInN. For example, in a case where the light-emitting layer 36 includes AlGaInN as its quantum layer(s) and AlInN as its well layer(s), the light-emitting layer 36 may emit blue light having a central wavelength in a range of about 450 nm to about 495 nm.

However, the disclosure is not limited thereto. As another example, the light-emitting layer 36 may have a structure in which a semiconductor material having a large band gap energy and a semiconductor material having a small band gap energy are alternately stacked or may include group III to group V semiconductor materials depending on the wavelength of light to be emitted. The type of light emitted by the light-emitting layer 36 is not particularly limited. In some embodiments, the light-emitting layer 36 may emit light of a red or green wavelength range as desired, instead of blue light. The light-emitting layer 36 may have a length of about 0.05 μm to about 0.10 μm, but the disclosure is not limited thereto.

Light may be emitted not only from the circumferential surface, in a length direction, of the light-emitting element 30, but also from both sides of the light-emitting element 30. The directionality of the light emitted from the light-emitting layer 36 is not particularly limited.

The electrode layer 37 may be an ohmic contact electrode, but the disclosure is not limited thereto. As another example, the electrode layer 37 may be a Schottky contact electrode. The light-emitting element 30 may include at least one electrode layer 37. FIG. 4 illustrates that the light-emitting element 30 includes an electrode layer 37, but the disclosure is not limited thereto. As another example, the light-emitting element 30 may include more than one electrode layer 37, or the electrode layer 37 may not be provided. The following description of the light-emitting element 30 may also be directly applicable to a light-emitting element 30 including more than one electrode layer 37 or having a different structure from the light-emitting element 30 of FIGS. 4 through 6.

The electrode layer 37 may reduce the resistance between the light-emitting element 30 and electrodes (or contact electrodes) in case that the light-emitting element 30 is electrically connected to the electrodes (or contact electrodes). The electrode layer 37 may include a conductive metal. For example, the electrode layer 37 may include at least one of Al, Ti, In, gold (Au), Ag, ITO, IZO, and ITZO. The electrode layer 37 may include a semiconductor material doped with an n-type or p-type dopant. However, the disclosure is not limited thereto.

The insulating film 38 may be disposed to surround the first and second semiconductor layers 31 and 32 and the electrode layer 37. For example, the insulating film 38 may be disposed to surround at least the light-emitting layer 36 and may extend in the direction in which the light-emitting element 30 extends. The insulating film 38 may protect the first semiconductor layer 31, the light-emitting layer 36, the second semiconductor layer 32, and the electrode layer 37. For example, the insulating film 38 may be formed to surround the sides of the first semiconductor layer 31, the light-emitting layer 36, the second semiconductor layer 32, and the electrode layer 37, and may expose both end portions of the light-emitting element 30 in the longitudinal direction.

FIGS. 4 through 6 illustrate that the insulating film 38 extends in the longitudinal direction of the light-emitting element 30 to cover the sides of the first semiconductor layer 31, the light-emitting layer 36, the second semiconductor layer 32, and the electrode layer 37, but the disclosure is not limited thereto. The insulating film 38 may cover only the sides of the light-emitting layer 36 and some of the first and second semiconductor layers 31 and 32 or may cover only part of the side of the electrode layer 37 so that the side of the electrode layer 37 may be partially exposed. The insulating film 38 may be formed to be rounded in a cross-sectional view, in a region adjacent to at least one end of the light-emitting element 30. A thickness WB of the insulating film 38 is illustrated in FIG. 6 as being uniform, but the disclosure is not limited thereto. As another example, the thickness WB of the insulating film 38 may vary in part from one area to another area. For example, the insulating film 38 may generally have a uniform thickness, but on the side of the electrode layer 37, the thickness WB of the insulating film 38 may gradually decrease toward the top surface of the electrode layer 37 so that the top surface of the insulating film 38 may be rounded in a cross-sectional view.

The thickness WB of the insulating film 38 may be about 10 nm to about 200 nm, but the disclosure is not limited thereto. The thickness WB of the insulating film 38 may be about 40 nm to about 120 nm.

The insulating film 38 may include a material with insulating properties such as silicon oxide ($SiO_x$), silicon nitride ($SiN_x$), silicon oxynitride ($SiO_xN_y$), aluminum nitride (AlN), aluminum oxide ($Al_xO_y$), titanium oxide ($TiO_x$), zirconium oxide ($ZrO_x$), or hafnium oxide ($HfO_x$). Therefore, the insulating film 38 may prevent a short circuit that may occur in case that the light-emitting layer 36 directly contacts electrodes that transmit electrical signals directly to the light-emitting element 30. Since the insulating film 38 includes the light-emitting layer 36 to protect the outer surface of the light-emitting element 30, any degradation in the emission efficiency of the light-emitting element 30 may be prevented.

The outer surface of the insulating film 38 may be subjected to a surface treatment. The light-emitting element 30 may be sprayed on electrodes while being scattered in predetermined ink. Here, the surface of the insulating film 38 may be hydrophobically or hydrophilically treated to keep the light-emitting element 30 scattered in ink without agglomerating with other neighboring light-emitting elements 30. For example, the insulating film 38 may be surface-treated with a material such as stearic acid or 2,3-naphthalene dicarboxylic acid.

The light-emitting element 30 may include the shell layer 39, which is formed on the outer surfaces of the first and second semiconductor layers 31 and 32. The shell layer 39 may be formed as a separate layer and may be disposed to surround the outer surfaces of the first and second semiconductor layers 31 and 32. For example, the shell layer 39 may be disposed on the sides of the first semiconductor layer 31, the light-emitting layer 36, the second semiconductor layer 32, and the electrode layer 37 to form physical interfaces between the insulating film 38 and the first and second semiconductor layers 31 and 32, but the disclosure is not limited thereto. In another example, the shell layer 39 may be formed not as a separate layer, but as a particular area having a uniform thickness, adjacent to the outer surfaces of the first and second semiconductor layers 31 and 32, which will be described below.

The light-emitting element 30 may be obtained by forming semiconductor layers on a target substrate by epitaxial growth and etching the grown semiconductor layers in a direction perpendicular to the top surface of the target substrate. The semiconductor layers may be smoothly grown on the target substrate without any inter-crystal lattice defects, depending on the growth conditions, but during the etching of the semiconductor layers, defects may occur on the etched surfaces of the semiconductor layers. For example, if the first semiconductor layer 31 is obtained by growing a semiconductor layer including n-GaN on the target substrate and etching the semiconductor layer, defects such as gallium (Ga) vacancies or dangling bonds may be formed on the outer surface of the first semiconductor layer 31. Such defects may cause the leakage of electrons from the first semiconductor layer 31, and as a result, the number of electrons that do not emit light in the light-emitting layer 36 may increase. As another example, electrons may be trapped on the surfaces having such defects to cause non-emission couplings so that the electrons may be converted into heat, rather than into light. Accordingly, the amount of heat generated by the light-emitting element 30 may increase, or fluorescence quenching may occur, and as a result, the emission efficiency of the light-emitting element 30 may decrease.

To prevent this, the light-emitting element 30 may include the shell layer 39, which is formed on the outer surfaces of the first and second semiconductor layers 31 and 32, and thus, any defects on the outer surfaces of the first and second semiconductor layers 31 and 32, which are formed after an etching process during the fabrication of the light-emitting element 30, may be compensated for. As the shell layer 39 is formed on the outer surfaces of the first and second semiconductor layers 31 and 32 that are exposed by etching, any Ga vacancies formed after the etching may be filled with the shell layer 39. Accordingly, the light-emitting element 30 may prevent the flow of electrons due to such defects or the occurrence of non-emission couplings, thereby improving light conversion efficiency.

The shell layer 39 of the light-emitting element 30 may include a divalent metal element. For example, the shell layer 39 may include at least one of beryllium (Be), magnesium (Mg), calcium (Ca), strontium (Sr), barium (Ba), zinc (Zn), and cadmium (Cd). The divalent metal element of the shell layer 39 may compensate for defects in the first and second semiconductor layers 31 and 32 by filling Ga vacancies formed on the outer surfaces of the first and second semiconductor layers 31 and 32. For example, the number of defects in the first semiconductor layer 31 may be reduced by filling the defects in the first semiconductor layer 31 with a divalent group II or XII metal element. Specifically, in a case where the first semiconductor layer 31 is doped with n-type impurities, the concentration of electrons on an outer surface of the first semiconductor layer 31 may become lower than that of electrons on an inner surface of the first semiconductor layer 31 because of a compensation doping effect resulting from the filling of vacancies in the first semiconductor layer 31 with the divalent metal element of the shell layer 39, and most of the electrons injected into the light-emitting element 30 may flow on the inner surface of the light-emitting element 30, rather than on the outer surface of the light-emitting element 30. For example, the leakage of electrons that may be caused by defects in the first semiconductor layer 31 or non-emission couplings that may be caused by trapped electrons may be prevented. Therefore, the emission efficiency of the light-emitting element 30 may be improved, and the amount of heat generated by the light-emitting element 30 may be reduced.

In contrast, as a semiconductor layer other than the first semiconductor layer 31, for example, the second semiconductor layer 32, is doped with p-type impurities, the doping concentration of the p-type impurities may differ from one location to another location in the second semiconductor layer 32 because the vacancies in the second semiconductor layer 32 being filled with the divalent metal element of the shell layer 39, which is formed on the outer surface of the second semiconductor layer 32. The shell layer 39 may function as an insulating layer surrounding the second semiconductor layer 32 and may protect the second semiconductor layer 32, rather than providing a doping compensation effect on the second semiconductor layer 32. For example, as the shell layer 39 of the light-emitting element 30 includes a divalent metal element, the shell layer 39 may provide a doping compensation effect on the first semiconductor layer 31 so that the density of electrons may change in the first semiconductor layer 31. As the doping concentration of impurities changes in the second semiconductor layer 32, the shell layer 39 may function as an insulating layer. Since the light-emitting element 30 includes the shell layer 39 to compensate for any defects in the first and second semiconductor layers 31 and 32 during the fabrication of the light-emitting element 30, the light conversion efficiency and the emission characteristics of the light-emitting element 30 may be improved.

For example, the shell layer 39 may include an inorganic compound with a divalent metal element and may be disposed to surround the first and second semiconductor layers 31 and 32. The shell layer 39 may be formed of an inorganic compound in which a divalent cation metal and a divalent anion non-metal are combined. For example, the shell layer 39 may include at least one of ZnS, ZnSe, MgS, MgSe, ZnMgS, and ZnMgSe. In case that the shell layer 39 is formed of an inorganic compound such as ZnS, ZnSe, MgS, MgSe, ZnMgS, or ZnMgSe, as a separate layer from the first and second semiconductor layers 31 and 32 to form physical interfaces with the first and second semiconductor layers 31 and 32, the divalent cation metal element of the shell layer 39 may compensate for defects in the first and second semiconductor layers 31 and 32 by filling the vacancies formed on the surfaces of the first and second semiconductor layers. In this case, the insulating film 38 may be formed by being directly bonded with the inorganic compound of the shell layer 39. The insulating film 38, which includes an inorganic insulating material such as silicon oxide, may form a chemical bond with the shell layer 39, which is formed of a divalent cation metal element and a divalent anion non-metal element.

In some embodiments, the shell layer 39 formed as a separate layer may have a thickness WC of about 0.5 nm to about 10 nm. The shell layer 39 may be formed as a multilayer (e.g., quintuple layer) in which single layers formed of inorganic compound particles are stacked, but the disclosure is not limited thereto. In case that the thickness WC of the shell layer 39 is about 0.5 nm to about 10 nm, the shell layer 39 may compensate for defects in the first semiconductor layer 31 with a compensation doping effect without degrading the electrical properties of the first semiconductor layer 31. Since the light-emitting element 30 further includes the shell layer 39, which is disposed between the insulating film 38 and the semiconductor layers of the light-emitting element 30, defects formed in the semiconductor layers of the light-emitting element 30 during the fabrication of the light-emitting element 30 may be compensated for, and the optical efficiency of the light-emitting element 30 may be improved.

A height h of the light-emitting element 30 may be in a range of about 1 μm to about 10 μm, about 2 μm to about 6 μm, or about 3 μm to about 5 μm, but the disclosure is not limited thereto. A diameter WA of the light-emitting element 30 may be about 30 nm to about 700 nm, and the aspect ratio of the light-emitting element 30 may be about 1.2 to about 100, but the disclosure is not limited thereto. As another example, the light-emitting elements 30 included in the display device 10 may have different diameters depending on the difference between the compositions of the light-emitting layers 36. The light-emitting element 30 may have a diameter of about 500 nm.

Figure 7:
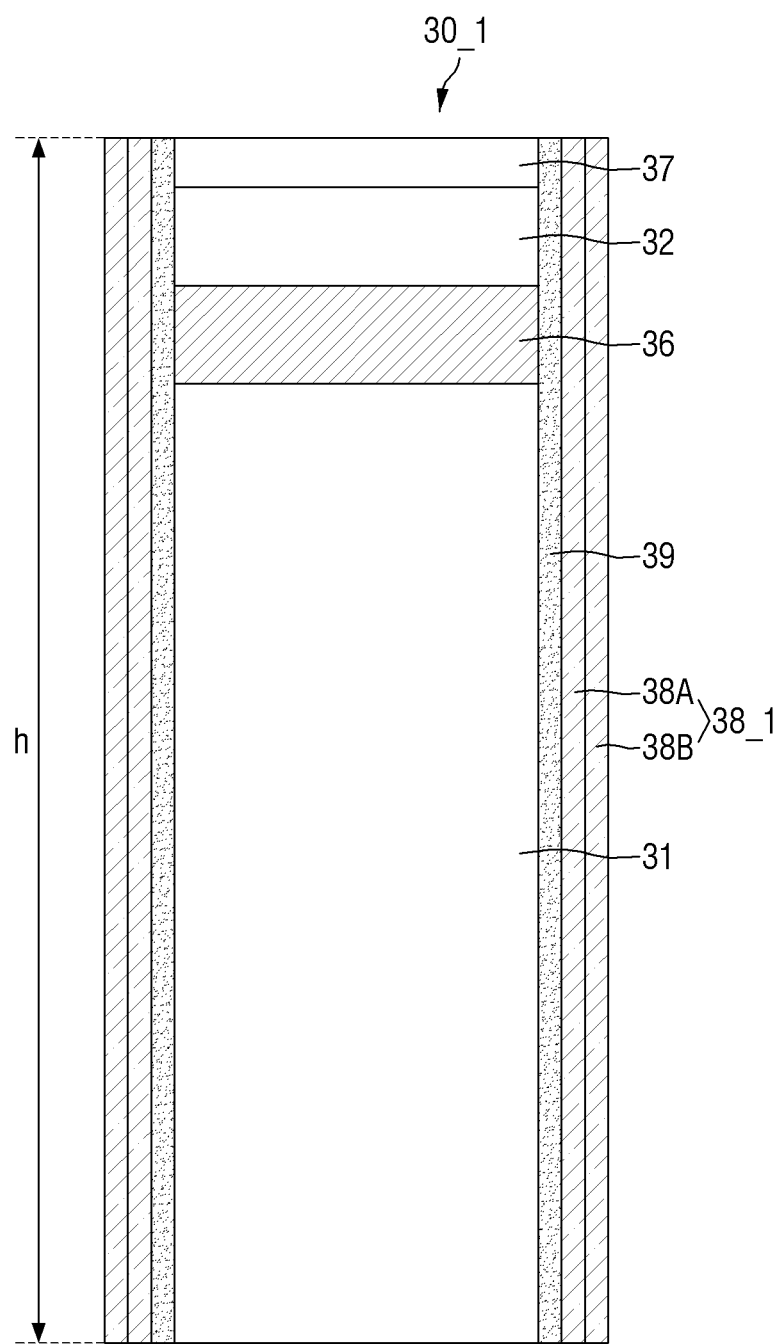
FIG. 7 is a schematic cross-sectional view of a light-emitting element according to another embodiment of the disclosure.

FIG. 7 is a schematic cross-sectional view of a light-emitting element according to another embodiment.

Referring to FIG. 7, an insulating film 38_1 of a light-emitting element 30_1 may include multiple layers (38A and 38B). The insulating film 38_1 may include a first layer 38A directly contacting a shell layer 39 and a second layer 38B, which surrounds the first layer 38A. The embodiment of FIG. 7 differs from the embodiment of FIG. 6 at least in that the insulating film 38_1 is formed as a multilayer. The insulating film 38_1 may be formed of an inorganic insulating material to protect a light-emitting layer 36, a first semiconductor layer 31, a second semiconductor layer 32, and an electrode layer 37 of the light-emitting element 30_1, but the amount of light generated by the light-emitting layer 36 may be affected by the type of the inorganic insulating material. The light generation efficiency of the light-emitting layer 36 may be reduced by an electric field from fixed charges in parts of the insulating film 38_1 adjacent to the light-emitting layer 36. In order to prevent this, the first layer 38A contacting the shell layer 39 on the outer surface of the light-emitting layer 36 and the second layer 38B, which is disposed on the outermost side of the light-emitting element 30_1, are formed of different materials. Therefore, the light-emitting layer 36 may be protected, and the optical efficiency of the light-emitting element 30_1 may be improved.

For example, the first layer 38A of the insulating film 38_1 may include silicon oxide, and the second layer 38B of the insulating film 38_1 may include aluminum oxide. As the first layer 38A directly contact the shell layer 39 inside the insulating film 38_1 contains silicon oxide, the light generation efficiency of the light-emitting layer 36 may be prevented from decreasing due to the fixed charges in the first layer 38A. As the second layer 38B, which is disposed on the outer surface of the first layer 38A, contains aluminum oxide, the light-emitting element 30_1 may be safely protected. The first and second layers 38A and 38B are illustrated in FIG. 7 as having the same thickness, but the disclosure is not limited thereto. As another example, the second layer 38A may be thicker than the second layer 38B.

The fabrication of the light-emitting element 30 of FIG. 4 will hereinafter be described.

Figure 8:
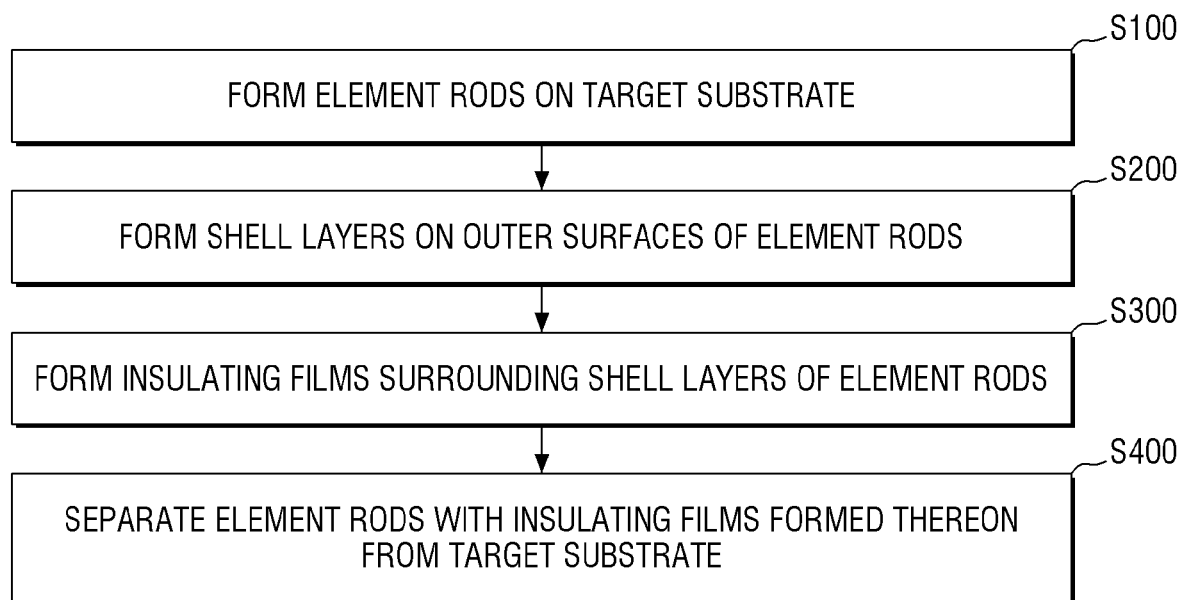
FIG. 8 is a schematic flowchart illustrating a method of fabricating a light-emitting element according to an embodiment of the disclosure.

FIG. 8 is a schematic flowchart illustrating a method of fabricating a light-emitting element according to an embodiment.

Referring to FIG. 8, the method may include forming element rods ROD on a target substrate 100 (S100); forming shell layers 39 on the outer surfaces of the element rods ROD (S200); forming insulating films 38 to surround the shell layers 39 of the element rods ROD (S300); and separating the element rods ROD with the insulating films 38 formed therein from the target substrate 100 (S400). In S100, the element rods ROD may be formed by an etching process in which semiconductor layers are vertically etched, and then, the shell layers 39 may be formed to compensate for any defects formed on the outer surfaces of the element rods ROD. The method of FIG. 8 will hereinafter be described in further detail with reference to FIGS. 9 through 18.

FIGS. 9 through 18 are schematic views illustrating the method of FIG. 8.

Figure 9:
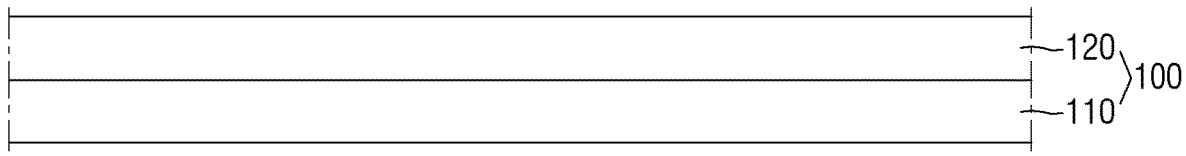
FIGS. 9 to 18 are schematic diagrams illustrating the method of FIG. 8.

Referring to FIG. 9, the target substrate 100 including a base substrate 110 and a buffer material layer 120 formed on the base substrate 110 may be prepared. The base substrate 110 may include a transparent substrate such as a sapphire ($Al_2O_3$) substrate or a glass substrate, but the disclosure is not limited thereto. As another example, the base substrate 110 may be a conductive substrate formed of, for example, GaN, SiC, ZnO, Si, GaP, or GaAs. The base substrate 110 will hereinafter be described as being, for example, a sapphire substrate. The thickness of the base substrate 110 is not particularly limited, but the base substrate 110 may have a thickness of about 400 μm to about 1500 μm.

Semiconductor layers may be formed on the base substrate 110. The semiconductor layers may be grown by epitaxial growth and may be formed by growing seed crystals. The semiconductor layers may be formed by electron beam deposition, physical vapor deposition (PVD), chemical vapor deposition (CVD), plasma laser deposition (PLD), dual-type thermal evaporation, sputtering, or metal organic chemical vapor deposition (MOCVD), but the disclosure is not limited thereto.

The type of precursor material for forming the semiconductor layers is not particularly limited. For example, the precursor material may include a metal precursor with an alkyl group such as a methyl group or an ethyl group. For example, the metal precursor may be a compound such as trimethyl gallium ($Ga(CH_3)_3$), trimethyl aluminum ($Al(CH_3)_3$), and triethyl phosphate ($(C_2H_5)_3PO_4$), but the disclosure is not limited thereto. The semiconductor layers may be formed by a deposition process using the metal precursor and a non-metal precursor. Descriptions of how and in what conditions to form the semiconductor layers will be omitted, and instead, the order in which to fabricate light-emitting elements 30 and the stack structure of the light-emitting elements 30 will hereinafter be described.

A buffer material layer 120 may be formed on the base substrate 110. FIG. 9 illustrates that a single buffer material layer 120 is deposited on the base substrate 110, but the disclosure is not limited thereto. As another example, multiple buffer material layers 120 may be formed. The buffer material layer 120 may be disposed to reduce the difference in lattice constant between a first semiconductor material layer 310 and the base substrate 110.

For example, the buffer material layer 120 may include an undoped semiconductor. The buffer material layer 120 may include the same material as the first semiconductor material layer 310 and may include a material not doped with n- or p-type impurities. For example, the buffer material layer 120 may include at least one of InAlGaN, GaN, AlGaN, InGaN, AlN, and InN, but the disclosure is not limited thereto. The buffer material layer 120 may not be provided depending on the type of the base substrate 110. The buffer material layer 120 will hereinafter be described as being formed of an undoped semiconductor, on the base substrate 110.

Figure 10:
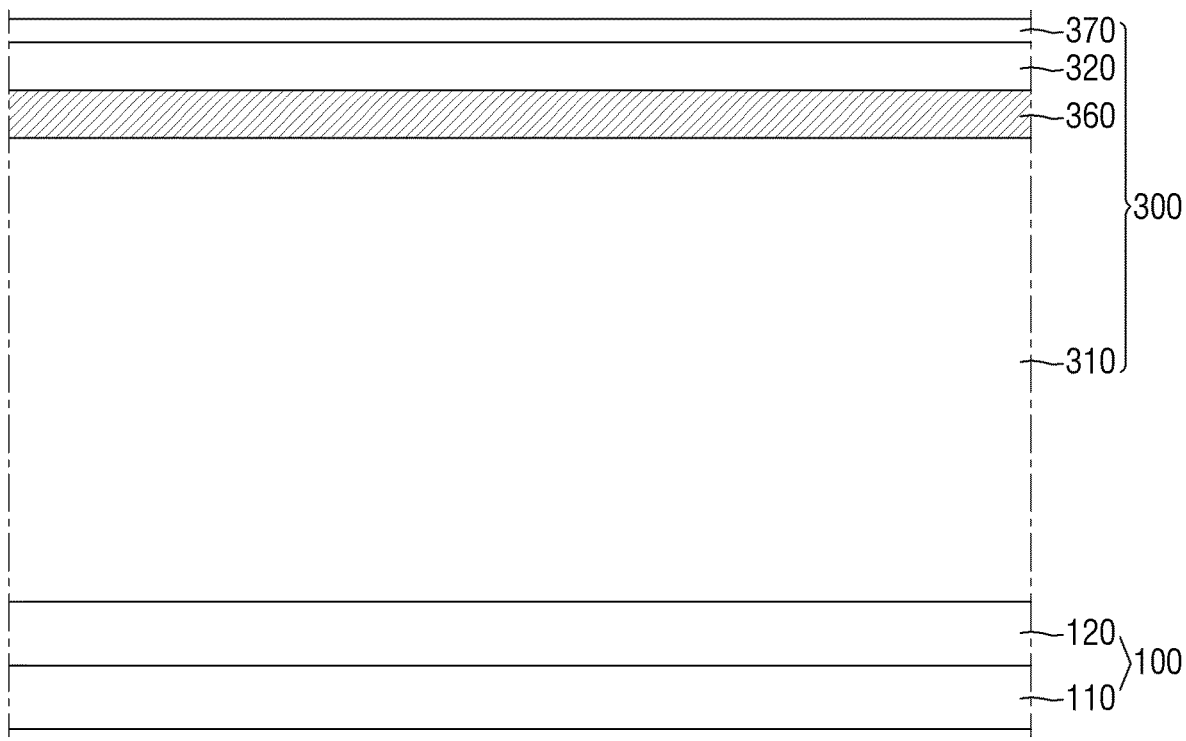

Thereafter, referring to FIG. 10, a semiconductor structure 300 may be formed on the target substrate 100. The semiconductor structure 300 may include the first semiconductor material layer 310, a light-emitting material layer 360, a second semiconductor material layer 320, and an electrode material layer 370. The material layers of the semiconductor structure 300 may be formed by a typical process as described above and may correspond to the layers of each of light-emitting elements 30 to be formed. For example, the first semiconductor material layer 310, the light-emitting material layer 360, the second semiconductor material layer 320, the electrode material layer 370, a first semiconductor layer 31, a light-emitting layer 36, a second semiconductor layer 32, and an electrode layer 37 of each of the light-emitting elements 30 may include the same materials.

Figure 11:
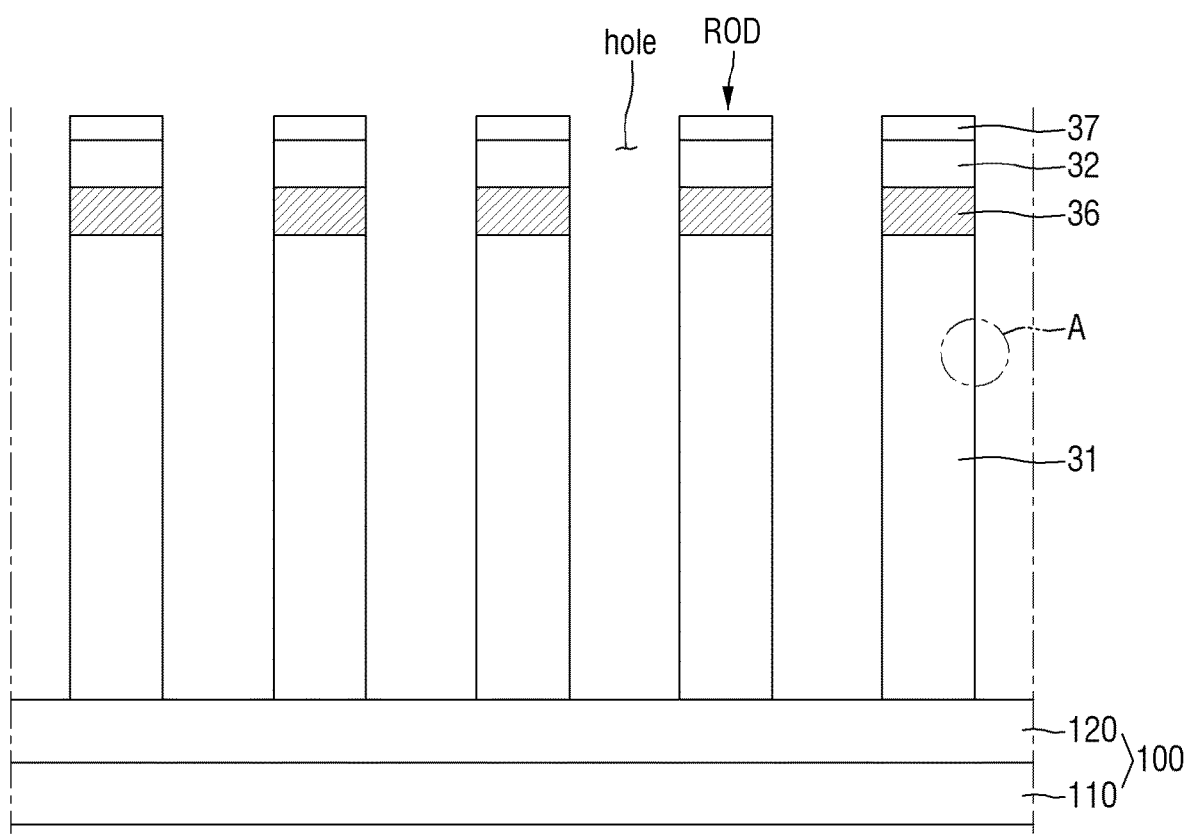

Thereafter, referring to FIG. 11, element rods ROD, which are spaced apart from one another, are formed by etching the semiconductor structure 300. The semiconductor structure 300 may be etched by a typical patterning method. For example, the semiconductor structure 300 may be etched by forming an etching mask layer on the semiconductor structure 300 and etching the semiconductor structure 300 in a direction perpendicular to the target substrate 100 by using the etching mask layer.

For example, the etching of the semiconductor structure 300 may be performed by dry etching, wet etching, reactive ion etching (ME), or inductively coupled plasma-reactive ion etching (ICP-RIE). Dry etching, which is anisotropic etching, may be suitable to perpendicularly etch the semiconductor structure 300. During the etching of the semiconductor structure 300, $Cl_2$ or $O_2$ may be used as an etchant, but the disclosure is not limited thereto. In some embodiments, the etching of the semiconductor structure 300 may be performed by both dry etching and wet etching. For example, the semiconductor structure 300 may be etched first in a depth direction by dry etching and may then be etched by wet etching, which is isotropic etching, such that etched sidewalls thereof may fall on a plane (or planes) perpendicular to the surface of the semiconductor structure 300.

As a result of the etching of the semiconductor structure 300, holes may be formed in the semiconductor structure 300, and the first semiconductor material layer 310, the light-emitting material layer 360, the second semiconductor material layer 320, and the electrode material layer 370 may form element rods ROD, and each of the element rods ROD may include a first semiconductor layer 31, a light-emitting layer 36, a second semiconductor layer 32, and an electrode layer 37. The element rods ROD may be spaced apart from one another with the holes therebetween. The buffer material layer 120 of the target substrate 100 may be partially exposed in or by the holes by which the element rods ROD are spaced apart from one another.

Figure 12:
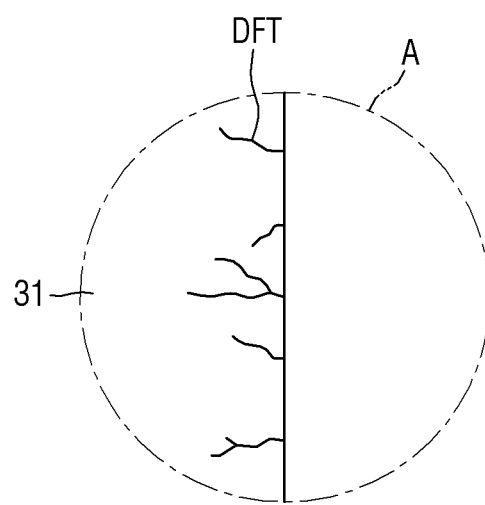

As a result of the etching of the semiconductor structure 300, defects may be formed on the outer surfaces of the element rods ROD. Referring to FIG. 12, an enlarged diagram illustrating area A of FIG. 11 shows that defects DFT such as vacancies may be formed on the outer surfaces of first semiconductor layers 31 exposed by the etching of the semiconductor structure 300. As mentioned above, the defects DFT may cause the leakage of injected electrons or non-emission couplings and may lower the optical efficiency of the light-emitting elements 30. To prevent this, the element rods ROD may be formed by etching the semiconductor structure 300 during the fabrication of the light-emitting element 30, and then shell layers 39 may be formed to compensate for the defects DFT formed in the first semiconductor layers 31.

Figure 13:
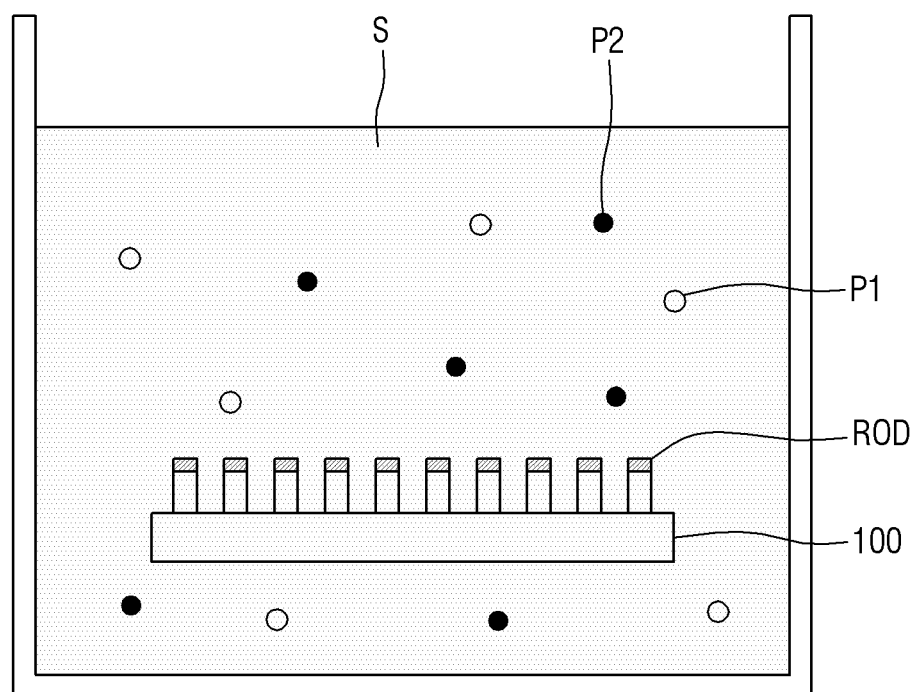
Figure 14:
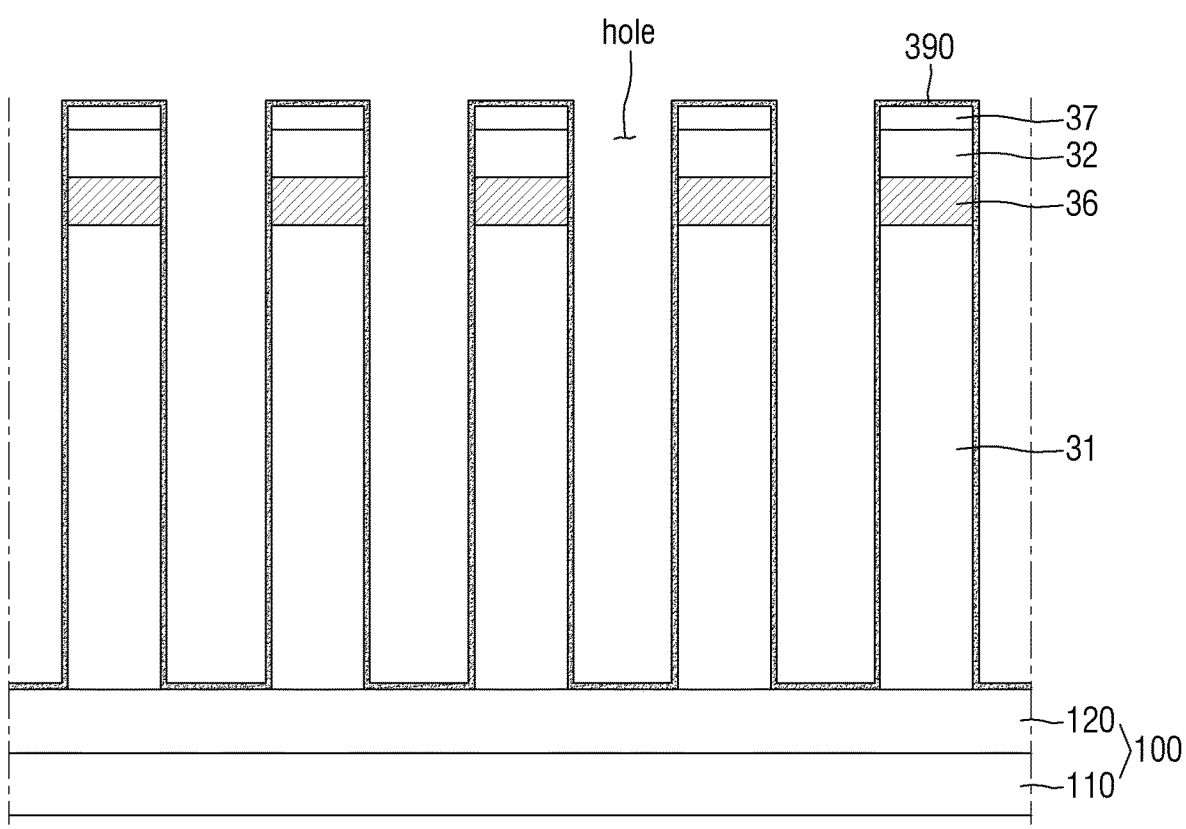

Referring to FIGS. 13 and 14, a shell material layer 390, which surrounds the outer surfaces of the element rods ROD, may be formed by immersing the target substrate 100 with the element rods ROD formed thereon in a solution S containing first and second precursor materials P1 and P2, which are to form the shell layers 39. For example, the shell layers 39 included in the light-emitting elements 30 may be formed by a wet process using the solution S, in which the first and second precursor materials P1 and P2 are mixed. In case that the target substrate 100 with the element rods ROD formed thereon is immersed in the solution S, the first and second precursor materials P1 and P2 in the solution S may react to the outer surfaces of the element rods ROD to form the shell material layer 390. The first precursor material P1 may include a divalent cation metal, and the second precursor material P2 may include a divalent anion non-metal. The shell material layer 390 may be formed not only on the side surfaces and the top surfaces of the element rods ROD, but also on the buffer material layer 120 of the target substrate 100. The shell material layer 390 may be partially removed during the formation of insulating films 38, thereby forming the shell layers 39, which surround the side surfaces of the element rods ROD.

Figure 15:
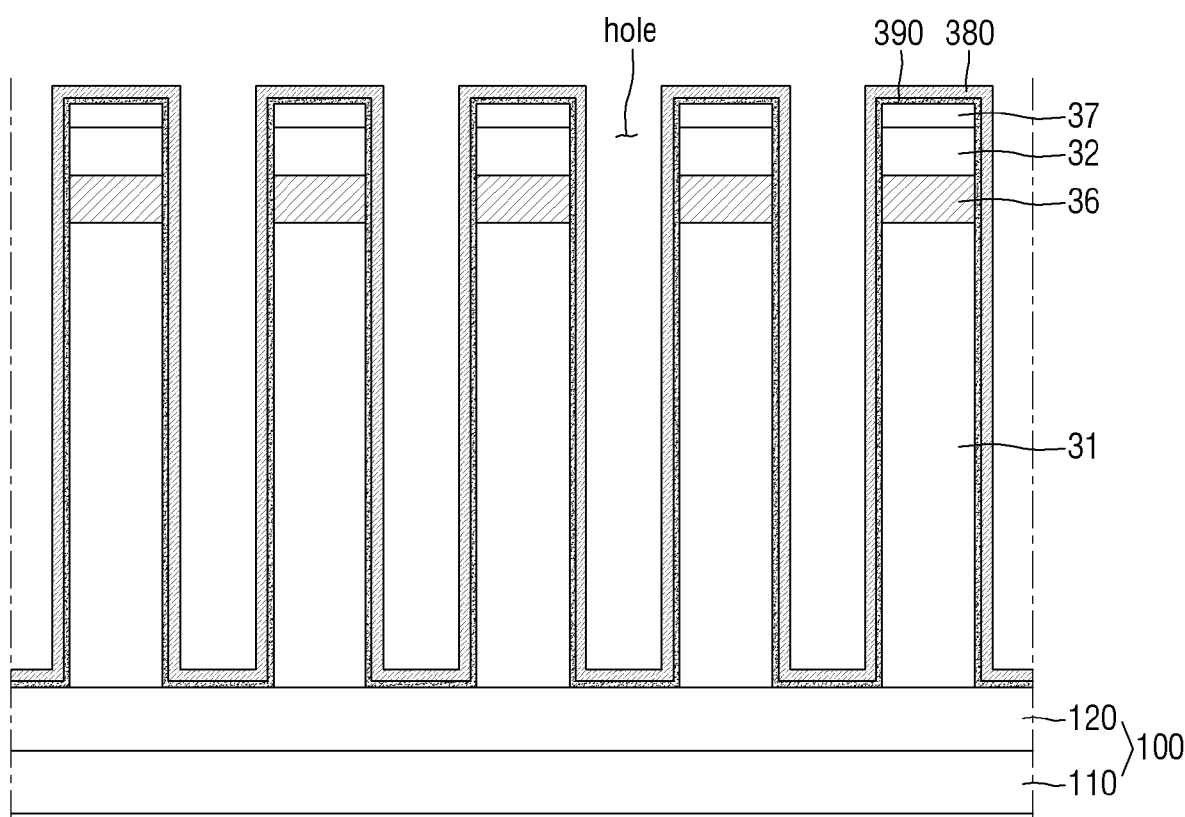
Figure 16:
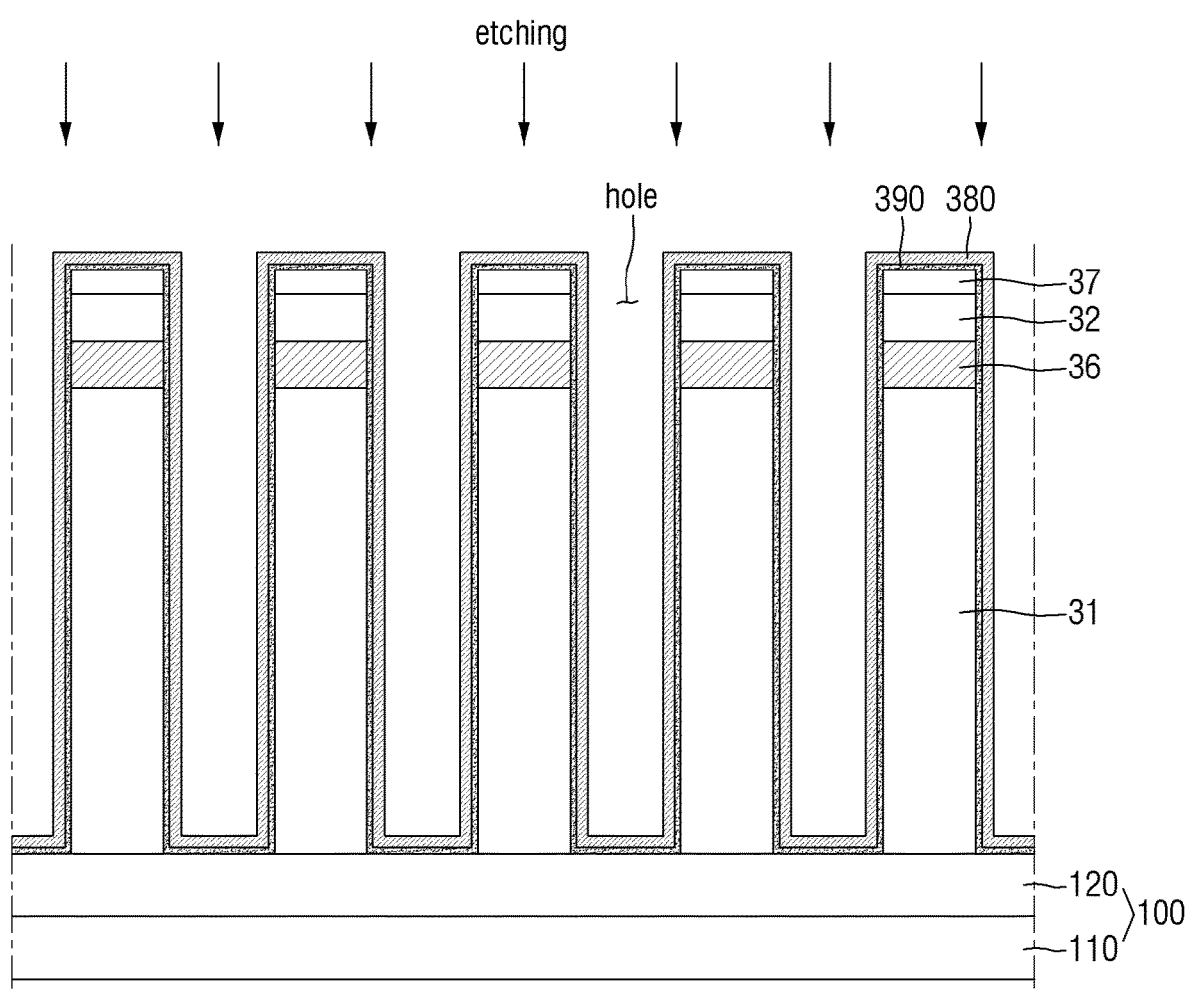
Figure 17:
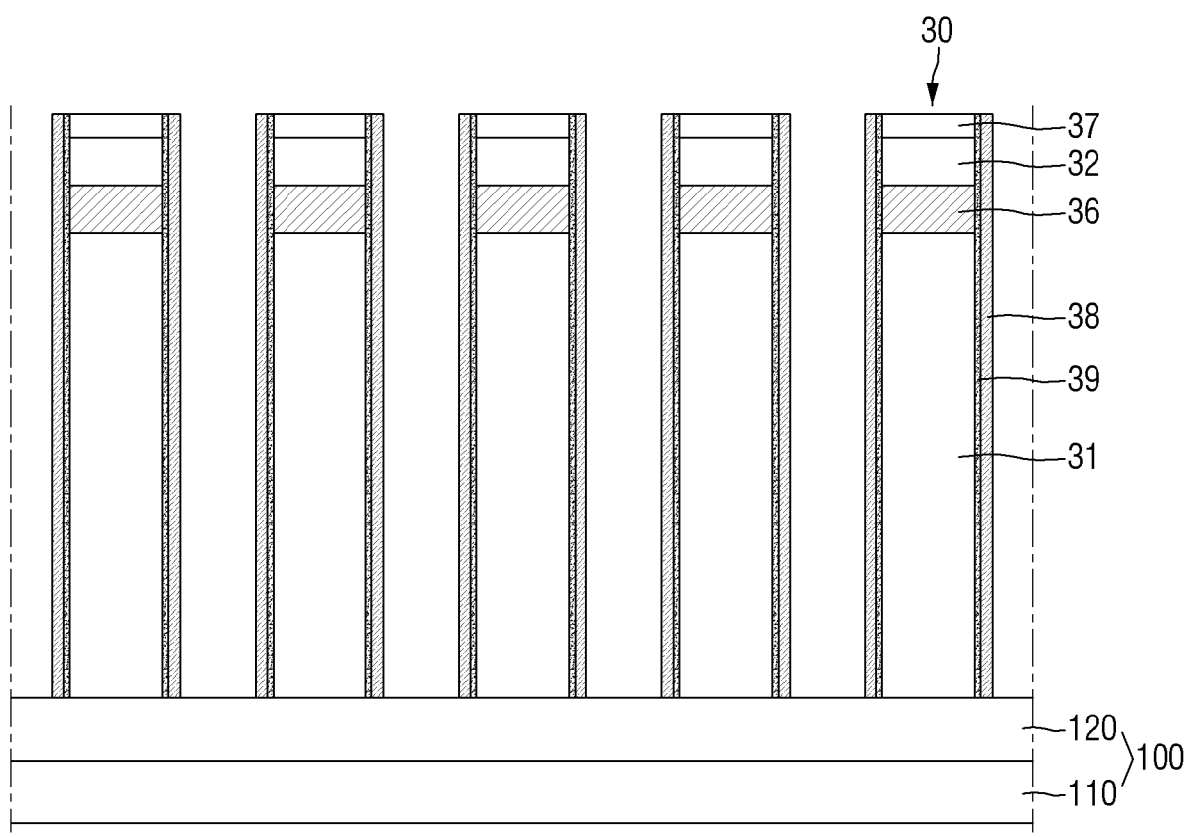

Thereafter, referring to FIGS. 15 through 17, the insulating films 38 may be formed to surround parts of the side surfaces of the element rods ROD, on which the shell material layer 390 is formed. The insulating films 38 may be formed by forming an insulating layer 380 on the shell material layer 390 and partially removing the insulating layer 380 and the shell material layer 390, as indicated by "etching" of FIG. 16, to expose first end portions of the element rods ROD, for example, the top surfaces of electrode layers 37 of the element rods ROD. As a result, the shell material layer 390 and the insulating layer 380 may be formed into the shell layers 39 and the insulating films 38, respectively.

The insulating layer 380, which is an insulating material formed on the outer surfaces of the element rods ROD, may be formed by applying an insulating material on the element rods ROD, which are vertically etched, or immersing the element rods ROD in an insulating material, but the disclosure is not limited thereto. For example, the insulating layer 380 may be formed by atomic layer deposition (ALD) or CVD.

Similar to the shell material layer 390, the insulating layer 380 may be formed on the side surfaces and the top surfaces of the element rods ROD and on parts of the target substrate 100, exposed between the element rods ROD. The insulating layer 380 and the shell material layer 390 may be partially removed by dry etching, which is anisotropic etching, or an etch-back process. As parts of the insulating layer 380 on the top surfaces of the element rods ROD are removed, the electrode layers 38 may be exposed and partially removed. For example, the thickness of the electrode layers 37 of the finally manufactured light-emitting elements 30 may be smaller than that of the electrode material layer 370 formed during the fabrication of the light-emitting elements 30.

The top surfaces of the electrode layers 37 are illustrated as being exposed, and the top surfaces of the insulating films 38 are illustrated as being flat. However, the disclosure is not limited thereto. As another example, the insulating films 38 may be formed to have partially curved outer surfaces in areas that surround the electrode layers 37. During the partial removal of the insulating layer 380, the top surfaces and side surfaces of the insulating layer 380 may be partially removed so that the insulating films 380 surrounding the layers included in each of the element rods ROD may be formed to have partially etched side surfaces. Specifically, as the top surfaces of the insulating layer 380 are removed, the insulating films 38 may be formed such that parts of the outer surfaces thereof adjacent to the electrode layers 37 may be partially removed.

Figure 18:
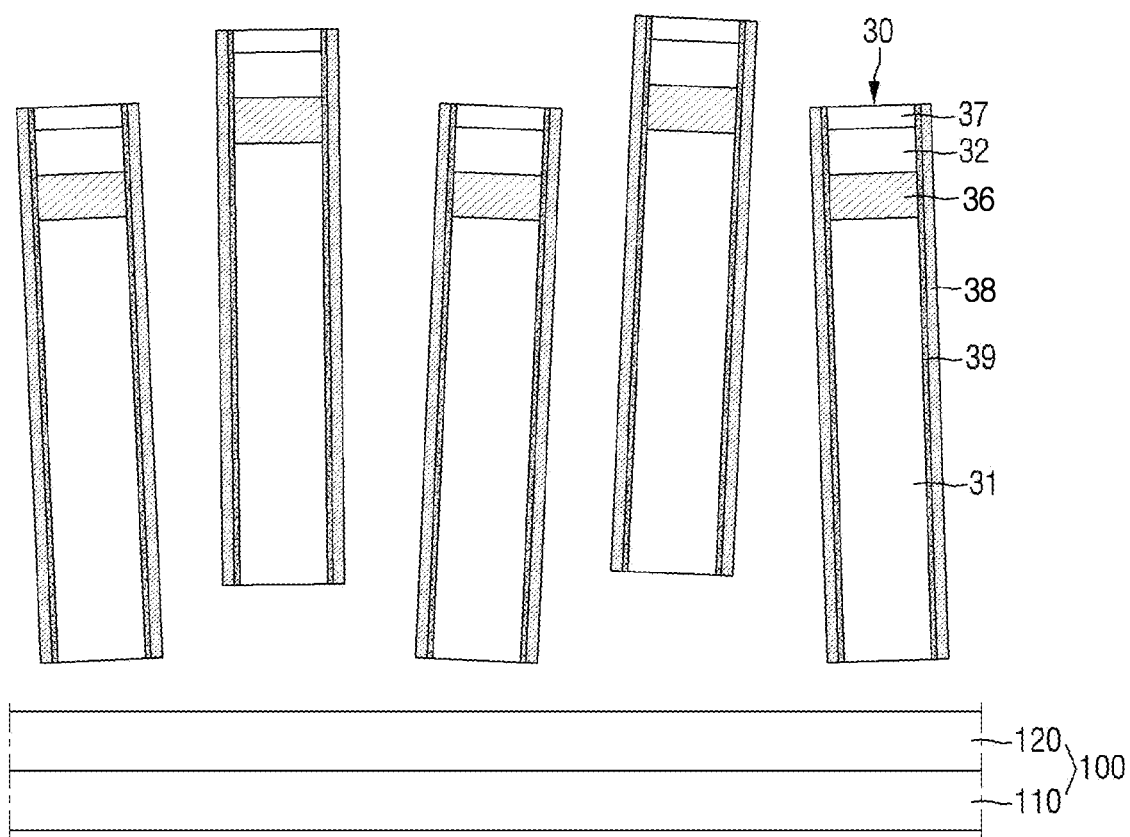

Thereafter, referring to FIG. 18, the element rods ROD with the shell layers 39 and the insulating films 38 formed therein may be separated from the target substrate 100, and thus the light-emitting elements 30 may be obtained. The light-emitting elements 30 may include the shell layers 39, which compensate for defects in the semiconductor layers of the semiconductor structure 300, formed by vertical etching. The method of FIG. 8 includes forming the shell layers 39 by a wet process, thereby producing light-emitting elements 30 while preventing the optical efficiency of the light-emitting elements 30 from being lowered.

The shape and the material of the light-emitting element 30 of FIG. 4 are not particularly limited. For example, the light-emitting element 30 may include more layers than, and have a different shape from, that of FIG. 4.

Figure 19:
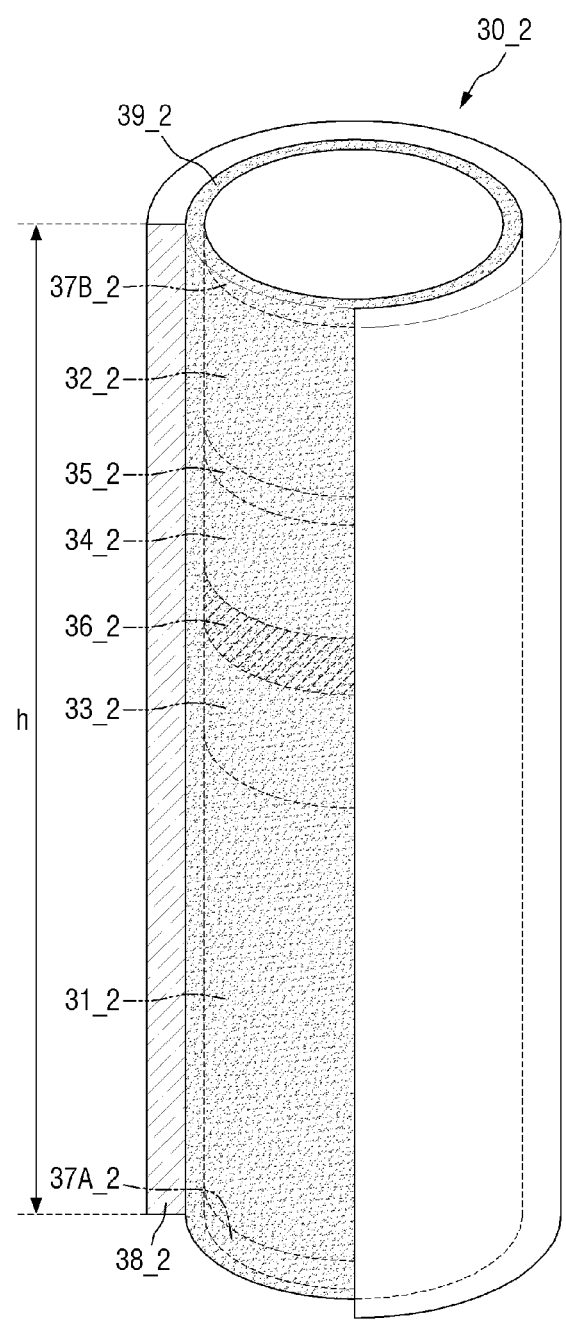
FIG. 19 is a schematic perspective view of a light-emitting element according to another embodiment of the disclosure.
Figure 20:
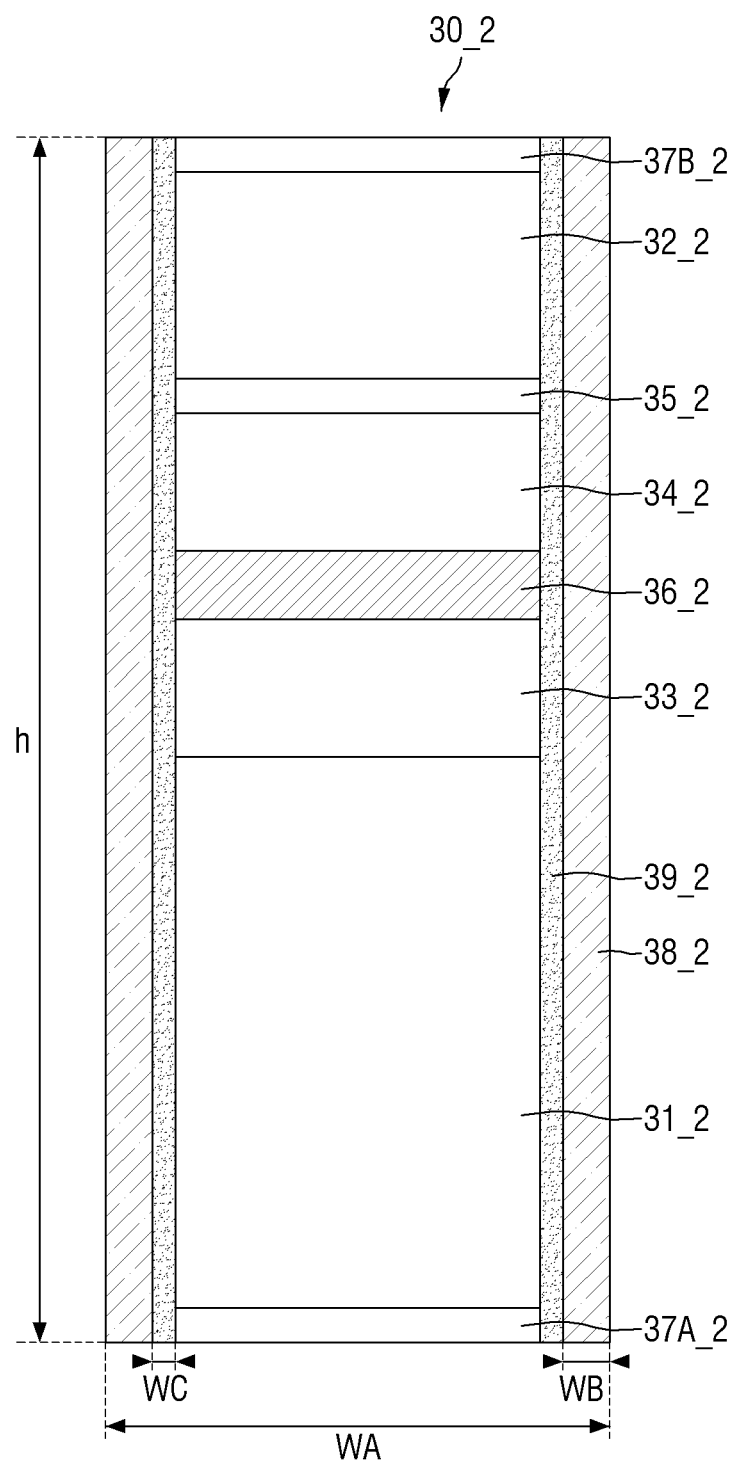
FIG. 20 is a schematic cross-sectional view of the light-emitting element of FIG. 19.

FIG. 19 is a schematic perspective view of a light-emitting element according to another embodiment. FIG. 20 is a schematic cross-sectional view of the light-emitting element of FIG. 19. FIG. 20 illustrates a schematic longitudinal cross-sectional view of a light-emitting element 30_2 of FIG. 19 and illustrates that semiconductor layers are stacked in the light-emitting element 30_2.

Referring to FIGS. 19 and 20, the light-emitting element 30_2 may further include a third semiconductor layer 33_2, which is disposed between a first semiconductor layer 31_2 and a light-emitting layer 36_2, and fourth and fifth semiconductor layers 34_2 and 35_2, which are disposed between the light-emitting layer 36_2 and a second semiconductor layer 32_2. The light-emitting element 30_2 may differ from the light-emitting element 30 of FIG. 4 at least in that the light-emitting element 30_2 further includes the third, fourth, and fifth semiconductor layers 33_2, 34_2, and 35_2 and electrode layers, for example, first and second electrode layers 37A_2 and 37B_2, and that the light-emitting layer 36_2 includes a different element from the light-emitting layer 36 of FIG. 4. The light-emitting element 30_2 will hereinafter be described, focusing mainly on the differences with the light-emitting element 30 of FIG. 4.

The light-emitting layer 36 of the light-emitting element 30 of FIG. 4 may include nitrogen (N) and may thus emit blue or green light. In contrast, the light-emitting layer 36_2 and the semiconductor layers of the light-emitting element 30_2 may include a semiconductor containing at least phosphorus (P). The light-emitting element 30_2 may emit red light having a central wavelength range of about 620 nm to about 750 nm. However, the central wavelength range of the red light emitted by the light-emitting element 30_2 is not particularly limited and should be understood as encompassing all wavelengths that may be perceived as red.

Specifically, the first semiconductor layer 31_2 may be an n-type semiconductor layer and may include a semiconductor material having the chemical formula $In_xAl_yGa_{1-x-y}P$ (where $0 \le x \le 1$, $0 \le y \le 1$, and $0 \le x+y \le 1$). The first semiconductor layer 31_2 may include one of InAlGaP, GaP, AlGaP, InGaP, AlP, and InP that are doped with an n-type dopant. For example, the first semiconductor layer 31_2 may be n-AlGaInP doped with n-type Si.

The second semiconductor layer 32_2 may be a p-type semiconductor layer and may include a semiconductor material having the chemical formula $In_xAl_yGa_{1-x-y}P$ (where $0 \le x \le 1$, $0 \le y \le 1$, and $0 \le x+y \le 1$). The second semiconductor layer 32_2 may include one of InAlGaP, GaP, AlGaNP, InGaP, AlP, and InP that are doped with a p-type dopant. For example, the second semiconductor layer 32_2 may be p-GaP doped with p-type Mg.

The light-emitting layer 36_2 may be disposed between the first and second semiconductor layers 31_2 and 32_2. The light-emitting layer 36_2 may include a material having a single quantum well structure or multi-quantum well structure and may thus emit light of a particular wavelength range. In a case where the light-emitting layer 36_2 has a structure in which a quantum layer and a well layer are alternately stacked, the quantum layer may include AlGaP or AlInGaP, and the well layer may include GaP or AlInP. For example, the light-emitting layer 36_2 may include AlGaInP as a quantum layer and AlInP as a well layer and may thus emit red light having a central wavelength range of about 620 nm to about 750 nm.

The light-emitting element 30_2 of FIG. 19 may include clad layers disposed adjacent to the light-emitting layer 36_2. As illustrated in FIG. 19, the third and fourth semiconductor layers 33_2 and 34_2, which are disposed between the first and second semiconductor layers 31_2 and 32_2, may be clad layers.

The third semiconductor layer 33_2 may be disposed between the first semiconductor layer 31_2 and the light-emitting layer 36_2. Similar to the first semiconductor layer 31_2, the third semiconductor layer 33_2 may be an n-type semiconductor and may include a semiconductor material having chemical formula $In_xAl_yGa_{1-x-y}P$ (where $0 \le x \le 1$, $0 \le y \le 1$, $0 \le x+y \le 1$). For example, the first semiconductor layer 31_2 may be n-AlGaInP, and the third semiconductor layer 33_2 may be n-AlInP. However, the disclosure is not limited to this example.

The fourth semiconductor layer 34_2 may be disposed between the light-emitting layer 36_2 and the second semiconductor layer 32_2. Similar to the second semiconductor layer 32_2, the fourth semiconductor layer 34_2 may be a p-type semiconductor and may include a semiconductor material having the chemical formula $In_xAl_yGa_{1-x-y}P$ (where $0 \le x \le 1$, $0 \le y \le 1$, and $0 \le x+y \le 1$). For example, the second semiconductor layer 32_2 may be p-GaP, and the fourth semiconductor layer 34_2 may be p-AlInP.

The fifth semiconductor layer 35_2 may be disposed between the second and fourth semiconductor layers 32_2 and 34_2. Similar to the second and fourth semiconductor layers 32_2 and 34_2, the fifth semiconductor layer 35_2 may include a semiconductor doped with a p-type dopant. In some embodiments, the fifth semiconductor layer 35_2 may be provided to reduce the difference in lattice constant between the second and fourth semiconductor layers 32_2 and 34_2. The fifth semiconductor layer 35_2 may be a TSBR layer. For example, the fifth semiconductor layer 35_2 may include p-GaInP, p-AlInP, or p-AlGaInP, but the disclosure is not limited thereto. The third, fourth, and fifth semiconductor layers 33_2, 34_2, and 35_2 may have a length of about 0.08 μm to about 0.25 μm, but the disclosure is not limited thereto.

The first and second electrode layers 37A_2 and 37B_2 may be disposed on the first and second semiconductor layers 31_2 and 32_2, respectively. The first electrode layer 37A_2 may be disposed on the bottom surface of the first semiconductor layer 31_2, and the second electrode layer 37B_2 may be disposed on the top surface of the second semiconductor layer 32_2. However, the disclosure is not limited thereto, and one of the first and second electrode layers 37A_2 and 37B_2 may not be provided. For example, the light-emitting element 30_2 may not have the first electrode layer 37A_2 on the bottom surface of the first semiconductor layer 31_2 but may include only the second electrode layer 37B_2 on the top surface of the second semiconductor layer 32_2.

A shell layer 39_2 may be disposed on the side surfaces of the first semiconductor layer 31_2, the third semiconductor layer 33_2, the light-emitting layer 36_2, the fourth semiconductor layer 34_2, the fifth semiconductor layer 35_2, the second semiconductor layer 32_2, and the first and second electrode layers 37A_2 and 37B_2, and an insulating film 38_2 may cover or overlap the shell layer 39_2. Similar to the light-emitting element 30 of FIG. 4, the light-emitting element 30_2 may be formed by vertically etching a semiconductor structure 300, and the shell layer 39_2 may be formed to compensate for defects that may be formed in the semiconductor layers of the light-emitting element 30_2 during the etching of the semiconductor structure 300. The light-emitting element 30_2 may include more semiconductor layers than the light-emitting element 30 of FIG. 4 and may emit red light.

The shell layer 39 of the light-emitting element 30 of FIG. 4, which is for compensating for defects formed in the semiconductor layers of the light-emitting element 30, particularly, in the first semiconductor layer 31 of the light-emitting element 30, may not necessarily be formed as a separate layer. As another example, the shell layer 39 may be formed by doping the semiconductor layers of the light-emitting element 30 with a divalent cation metal, and parts of the semiconductor layers of the light-emitting element 30 may be formed as the shell layer 39. In this case, the shell layer 39 may be formed as a doped region in the semiconductor layers of the light-emitting element 30, and the insulating film 38 may be disposed directly on the outer surfaces of the semiconductor layers of the light-emitting element 30.

Figure 21:
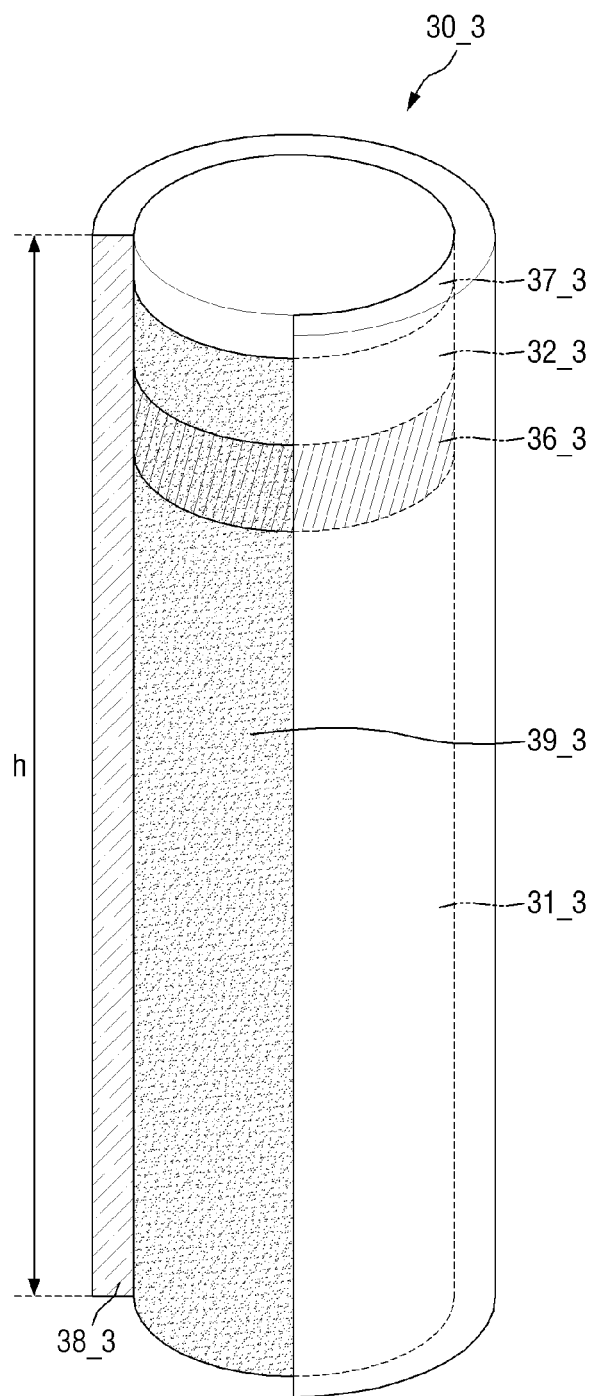
FIG. 21 is a schematic perspective view of a light-emitting element according to another embodiment of the disclosure.
Figure 22:
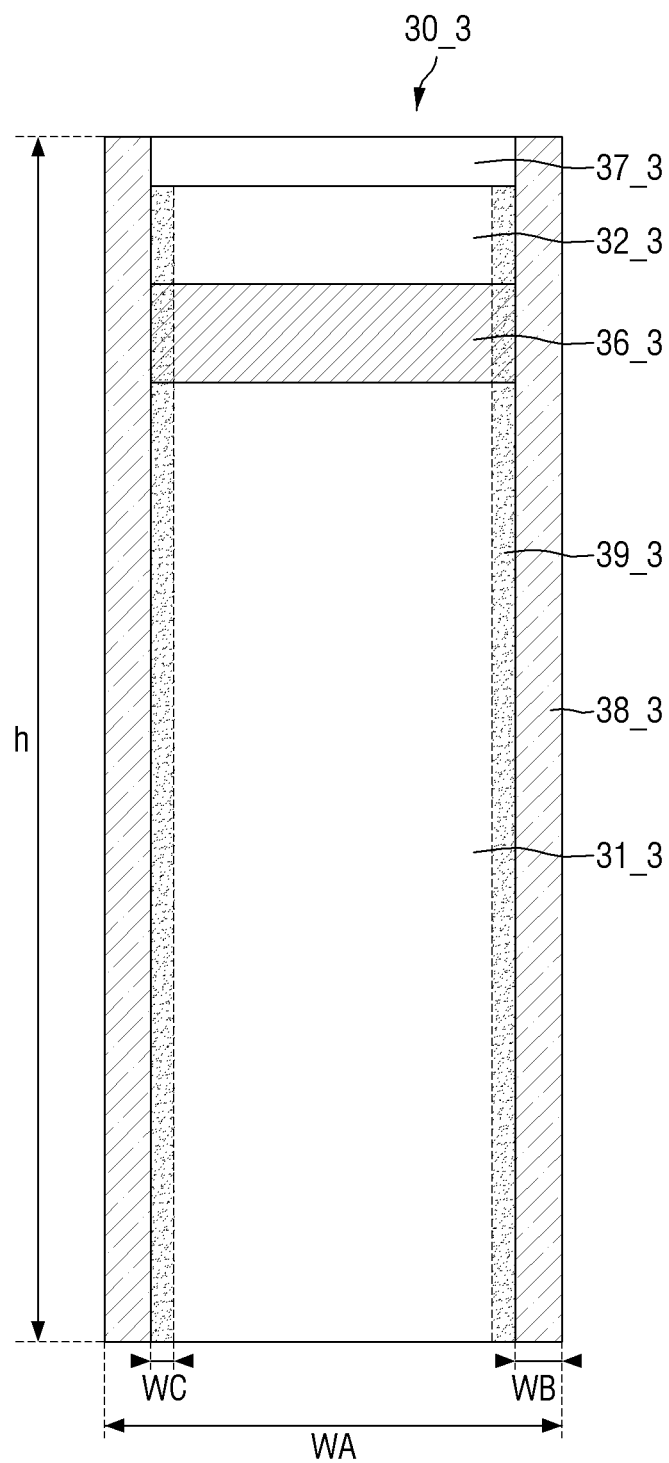
FIG. 22 is a schematic cross-sectional view of the light-emitting element of FIG. 21.

FIG. 21 is a schematic perspective view of a light-emitting element according to another embodiment. FIG. 22 is a schematic cross-sectional view of the light-emitting element of FIG. 21. FIG. 21 illustrates a light-emitting element 30_3 with part of an insulating film 38_3 removed to show semiconductor layers surrounded by the insulating film 38_3.

Referring to FIGS. 21 and 22, the light-emitting element 30_3 may include a shell layer 39_3, which is formed in parts of a first semiconductor layer 31_3, a light-emitting layer 36_3, and a second semiconductor layer 32_3 as a region doped with a divalent metal element. The shell layer 39_3 may be formed to have a predetermined thickness WC from the side surfaces of the first semiconductor layer 31_3, the light-emitting layer 36_3, and the second semiconductor layer 32_3. The light-emitting element 30_3 may differ from the light-emitting element 30 of FIGS. 4 through 6 at least in that the shell layer 39_3 is formed not as a separate layer disposed on the side surfaces of the semiconductor layers of the light-emitting element 30_3, but as a region doped with a divalent metal element into the semiconductor layers so that the shell layer 39_3 is formed to have no physical boundaries with the semiconductor layers. The light-emitting element 30_3 will hereinafter be described, focusing mainly on the differences with the light-emitting element 30 of FIGS. 4 through 6.

A divalent metal may have a similar size to the lattice size of semiconductor layer crystals containing Ga, and Ga vacancies formed in the first semiconductor layer 31_3 may be compensated for by directly doping the first semiconductor layer 31_3 with a particular metal element. During the fabrication of the light-emitting element 30_3, an element rod ROD may be formed by etching a semiconductor structure 300, and the side surface of the element rod ROD may be doped with a divalent metal by immersing the semiconductor structure 300 in a solution S in which a divalent cation metal is dispersed. The divalent cation metal included in the solution S may directly fill Ga vacancies and may form the shell layer 39_3, which is a doped region with a predetermined thickness from the outer surfaces of the semiconductor layers of the light-emitting element 30_3. The divalent cation metals may be doped into the first semiconductor layer 31_3, the second semiconductor layer 32_3, and the light-emitting layer 36_3, but not into the electrode layer 37_3. For example, the shell layer 39_3 may be formed in the first semiconductor layer 31_3, the second semiconductor layer 32_3, and the light-emitting layer 36_3, but not in the electrode layer 37_3. The first semiconductor layer 31_3, the second semiconductor layer 32_3, and the light-emitting layer 36_3 may include Ga, In and N, or P, may be formed by epitaxial growth, and may be selectively doped with a divalent cation metal. In contrast, the electrode layer 37_3, which includes a different material from the first semiconductor layer 31_3, the second semiconductor layer 32_3, and the light-emitting layer 36_3, for example, a material such as ITO, may not be doped with a divalent cation metal, and the shell layer 39_3 may not be formed in the electrode layer 37_3.

The shell layer 39_3, which is a doped region formed in the semiconductor layers of the light-emitting element 30_3, may provide effects similar to those when the shell layer 39 of FIG. 4 is formed as a separate layer. For example, similar to the shell layer 39 of FIG. 4, the shell layer 39_3, which is formed by divalent cation metal, may compensate for defects in the semiconductor layers, and the divalent cation metal doped into the second semiconductor layer 32_3 may function as an insulating layer.

Unlike the light-emitting element 30 of FIG. 4, the light-emitting element 30_3 may have a relatively small diameter WA, and the shell layer 39_3 may be formed as a doped region having a predetermined thickness from the side surfaces of the semiconductor layers. For example, the shell layer 39_3 of the light-emitting element 30_3 may include a divalent cation metal such as beryllium (Be), magnesium (Mg), calcium (Ca), strontium (Sr), barium (Ba), zinc (Zn), or cadmium (Cd). The shell layer 39_3, which is formed as a doped region, may have a thickness WC of about 0.1 Å to about 50 Å and may be doped with a divalent cation metal by an amount of about $10^{10}/cm^3$ to about $10^{18}/cm^3$, but the disclosure is not limited thereto. The thickness WC of the shell layer 39_3 and the amount by which the shell layer 39_3 is doped with a divalent cation metal may be controlled in accordance with the number or density of defects formed in the semiconductor layers of the light-emitting element 30_3. Since the light-emitting element 30_3 includes the shell layer 39_3, which is doped with a divalent metal element, defects that may be formed in the semiconductor layers during the fabrication of the light-emitting element 30_3 may be compensated for, and the emission efficiency of the light-emitting element 30_3 may be improved.

Figure 23:
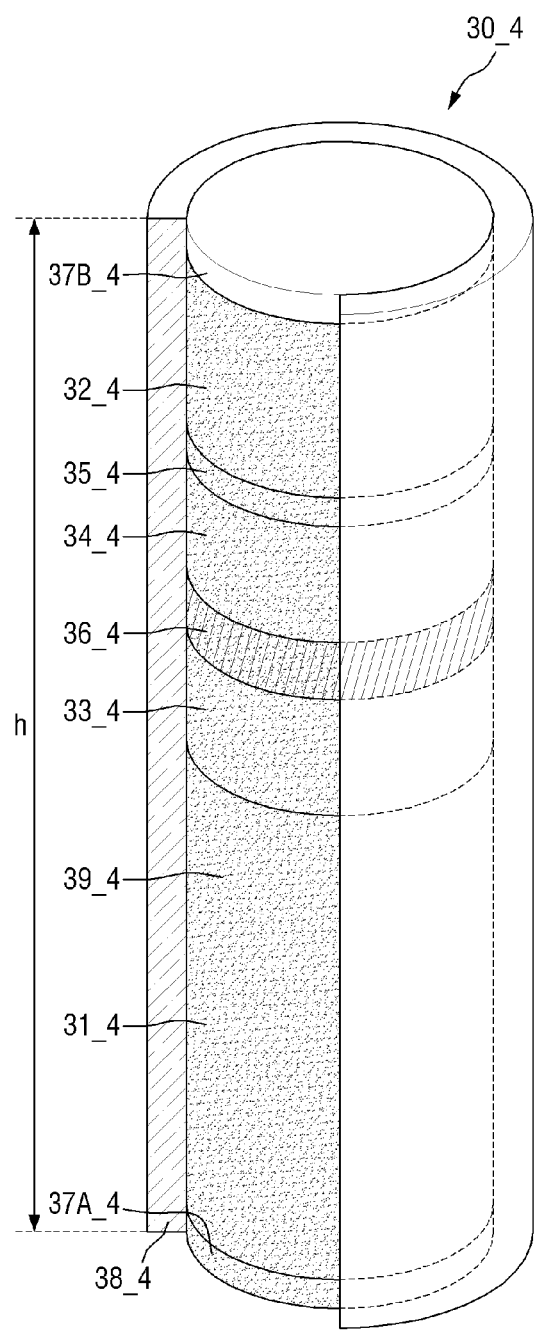
FIG. 23 is a schematic perspective view of a light-emitting element according to another embodiment of the disclosure.
Figure 24:
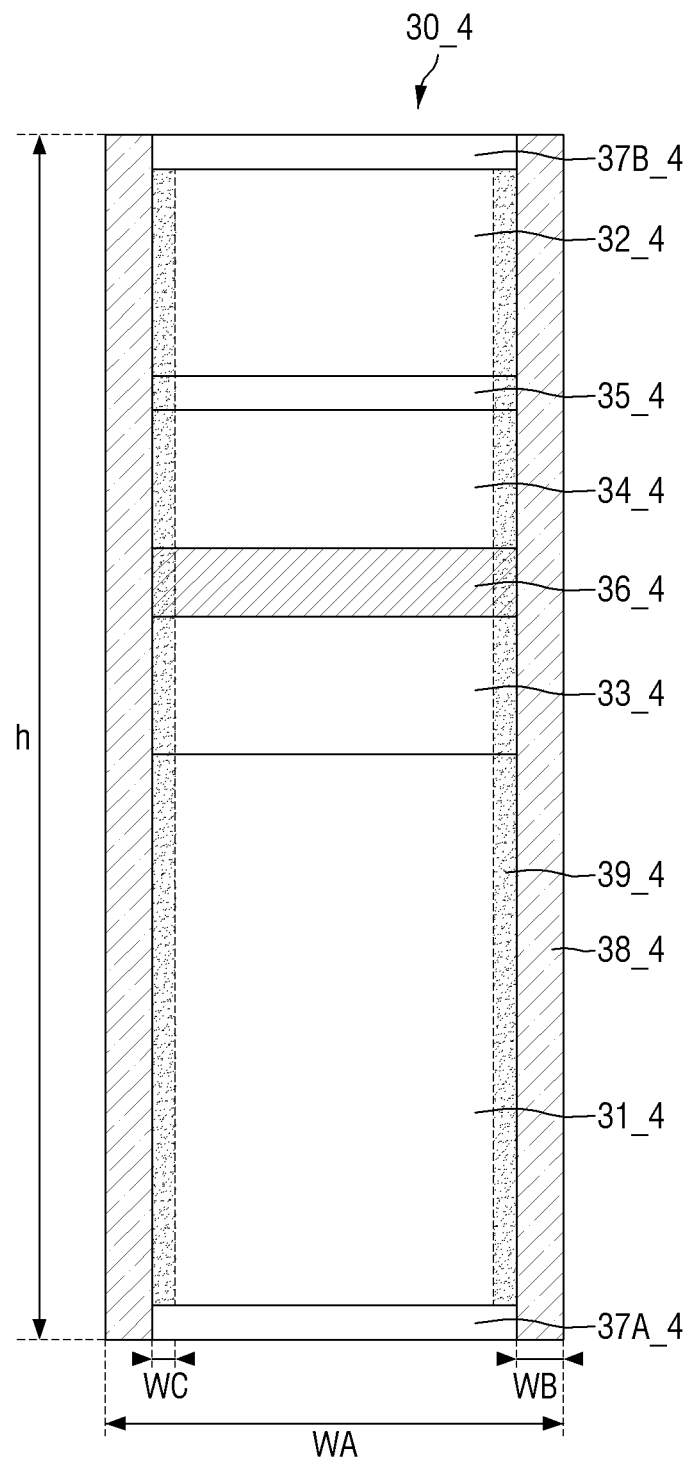
FIG. 24 is a schematic cross-sectional view of the light-emitting element of FIG. 23.

FIG. 23 is a schematic perspective view of a light-emitting element according to another embodiment. FIG. 24 is a schematic cross-sectional view of the light-emitting element of FIG. 23.

Referring to FIGS. 23 and 24, similar to the light-emitting element 30_2 of FIG. 19, a light-emitting element 30_4 may include semiconductor layers that contain P and emits red light. Similar to the shell layer 39_3 of the light-emitting element 30_3 of FIG. 21, a shell layer 39_4 of the light-emitting element 30_4 may be formed as a doped region on the outer surfaces of the semiconductor layers of the light-emitting element 30_4. The shell layer 39_4, which is a region formed in a first semiconductor layer 31_4, a second semiconductor layer 32_4, a third semiconductor layer 33_4, a fourth semiconductor layer 34_4, a fifth semiconductor layer 35_4, and a light-emitting layer 36_4 and doped with a group II or XII metal element, may be formed to have a predetermined thickness WC from the side surfaces of the semiconductor layers of the light-emitting element 30_4.

The shell layer 39_4 may not be formed in first and second electrode layers 37A_4 and 37B_4, and an insulating film 38_4 may be formed to cover the side surfaces of the shell layer 39_4 and the first and second electrode layers 37A_3 and 37B_4. The light-emitting element 30_4 may be a combination of the light-emitting elements 30_2 and 30_3 of FIGS. 19 and 21, and thus detailed descriptions thereof will be omitted.

Production examples of the light-emitting element 30 of FIG. 4 and the evaluation of the production examples will hereinafter be described.

Production Example 1: Fabrication of Light-Emitting Element Including Shell Layer Formed of Inorganic Compound Light-emitting elements 30 including shell layers 39 formed as separate layers from semiconductor layers were fabricated in accordance with the embodiment of FIG. 4. Specifically, a first semiconductor layer 31, a second semiconductor layer 32, a light-emitting layer 36, and an electrode layer 37, including GaN, were formed on a sapphire ($Al_2O_3$) substrate by epitaxial growth, and a shell layer 39 was formed while changing the type of inorganic compound used therein and the thickness of the shell layer 39, so that light-emitting element samples SAMPLE #1 through SAMPLE #8 were obtained.

In the light-emitting element samples SAMPLE #1 through SAMPLE #8, the type of precursor used to form the shell layer 39 may vary from one sample to another sample, depending on the type of metal element. Zinc nitrate was used as a precursor for a shell layer 39 containing Zn, and sodium sulfide was used as a precursor for a shell layer 39 containing sulfur (S). Each precursor was dissolved in distilled water at a concentration of about 0.01 mol to about 1.0 mol to prepare a precursor solution. The temperature of the precursor solution was about 60° C. when dipping each element rod ROD, and each element rod ROD was dipped for about 1 hour. Thereafter, each element rod ROD was taken out from the precursor solution, washed with distilled water, and dried, and in subsequent processes, the light-emitting element samples SAMPLE #1 through SAMPLE #8 were obtained.

Similar to the light-emitting element 30_1 of FIG. 7, each of the light-emitting element samples SAMPLE #1 through SAMPLE #8 may include a multilayer insulating film 38, which includes a first layer 38A having a thickness of about 80 nm and formed of silicon oxide ($SiO_2$) and a second layer 38B having a thickness of about 40 nm and formed of aluminum oxide ($Al_2O_3$). As a control group to be compared with the light-emitting element samples SAMPLE #1 through SAMPLE #8, light-emitting element samples SAMPLE #9 through SAMPLE #11 not including at least one of the shell layer 39 and the insulating film 38 were fabricated. The light-emitting element samples SAMPLE #1 through SAMPLE #11 fabricated in Production Example 1 are as shown in Table 1 below.

TABLE 1

| Light-Emitting Element Samples | Shell Layer (Ingredient/ Thickness) | Insulating Film ($SiO_2/Al_2O_3$) |
|---|---|---|
| SAMPLE #1 | ZnS/1 nm | $SiO_2$(80 nm)/$Al_2O_3$(40 nm) |
| SAMPLE #2 | ZnS/2 nm | $SiO_2$(80 nm)/$Al_2O_3$(40 nm) |
| SAMPLE #3 | ZnS/3 nm | $SiO_2$(80 nm)/$Al_2O_3$(40 nm) |
| SAMPLE #4 | ZnSe/2 nm | $SiO_2$(80 nm)/$Al_2O_3$(40 nm) |
| SAMPLE #5 | MgS/2 nm | $SiO_2$(80 nm)/$Al_2O_3$(40 nm) |
| SAMPLE #6 | MgSe/2 nm | $SiO_2$(80 nm)/$Al_2O_3$(40 nm) |
| SAMPLE #7 | ZnMgS/2 nm | $SiO_2$(80 nm)/$Al_2O_3$(40 nm) |
| SAMPLE #8 | ZnMgSe/2 nm | $SiO_2$(80 nm)/$Al_2O_3$(40 nm) |
| SAMPLE #9 | — | — |
| SAMPLE #10 | — | $SiO_2$(80 nm)/$Al_2O_3$(40 nm) |
| SAMPLE #11 | ZnS/2 nm | — |

Production Example 2: Fabrication of Light-Emitting Element Including Shell Layer Formed as Doped Region Light-emitting elements 30_3 having shell layers 39_3 formed as doped regions on the outside of semiconductor layers were fabricated in accordance with the embodiment of FIG. 21. A first semiconductor layer 31_3, a second semiconductor layer 32_3, a light-emitting layer 36_3, and an electrode layer 37_3, including GaN, were formed on a sapphire ($Al_2O_3$) substrate by epitaxial growth, and each element ROD was dipped in a solution where a precursor for forming a shell layer 39_3 was dissolved, and light-emitting element samples SAMPLE #12 through SAMPLE #18 were obtained.

In the light-emitting element samples SAMPLE #12 through SAMPLE #18, the type of precursor used to form the shell layer 39_3 may vary from one sample to another sample depending on the type of metal element used to form the shell layer 39_3. Zinc nitrate was used as a precursor for a shell layer 39_3 containing Zn, and sodium sulfide was used as a precursor for a shell layer 39_3 containing sulfur (S). Each precursor was dissolved in distilled water at a concentration of about 0.01 mol to about 1.0 mol to prepare a precursor solution. The temperature of the precursor solution was about 60° C. when dipping each element rod ROD, and each element rod ROD was dipped for about 1 hour. Thereafter, each element rod ROD was taken out from the precursor solution, washed with distilled water, and dried, and in subsequent processes, the light-emitting element samples SAMPLE #12 through SAMPLE #18 were obtained.

Similar to the light-emitting element 30_1 of FIG. 7, each of the light-emitting element samples SAMPLE #12 through SAMPLE #18 may include a multilayer insulating film 38, which includes a first layer 38A having a thickness of about 80 nm and formed of $SiO_2$ and a second layer 38B having a thickness of about 40 nm and formed of $Al_2O_3$. As a control group to be compared with the light-emitting element samples SAMPLE #12 through SAMPLE #18, light-emitting element samples SAMPLE #19 through SAMPLE #21 not including at least one of the shell layer 39_3 and the insulating film 38_3 were fabricated. The light-emitting element samples SAMPLE #12 through SAMPLE #21 fabricated in Production Example 2_are as shown in Table 2 below.

TABLE 2

| Light-Emitting Element Samples | Shell Layer (Metal Atom) | Insulating Film (SiO$_2$/Al$_2$O$_3$) |
| --- | --- | --- |
| SAMPLE #12 | Be | SiO$_2$(80 nm)/Al$_2$O$_3$(40 nm) |
| SAMPLE #13 | Mg | SiO$_2$(80 nm)/Al$_2$O$_3$(40 nm) |
| SAMPLE #14 | Ca | SiO$_2$(80 nm)/Al$_2$O$_3$(40 nm) |
| SAMPLE #15 | Sr | SiO$_2$(80 nm)/Al$_2$O$_3$(40 nm) |
| SAMPLE #16 | Ba | SiO$_2$(80 nm)/Al$_2$O$_3$(40 nm) |
| SAMPLE #17 | Zn | SiO$_2$(80 nm)/Al$_2$O$_3$(40 nm) |
| SAMPLE #18 | Cd | SiO$_2$(80 nm)/Al$_2$O$_3$(40 nm) |
| SAMPLE #19 | — | — |
| SAMPLE #20 | — | SiO$_2$(80 nm)/Al$_2$O$_3$(40 nm) |
| SAMPLE #21 | Zn | — |

Experimental Example 1: Evaluation of Emission Characteristics of Light-Emitting Elements The emission characteristics of the light-emitting element samples SAMPLE #1 through SAMPLE #11 produced in Production Example 1 were evaluated. Specifically, the photoluminescence of the light-emitting element samples SAMPLE #1 through SAMPLE #11 was evaluated, and the intensities of light having a central wavelength of about 445 nm and light having a central wavelength of about 560 nm, among beams of light emitted from each of the light-emitting element samples SAMPLE #1 through SAMPLE #11, were measured, and the results of the measurement were expressed relative to the intensity of light emitted from the light-emitting element sample SAMPLE #9, as shown in Table 3 below.

TABLE 3

| Light-Emitting Element Samples | Intensity of 445 nm light | Intensity of 560 nm Light |
| --- | --- | --- |
| SAMPLE #1 | 25 | 0.49 |
| SAMPLE #2 | 25 | 0.45 |
| SAMPLE #3 | 26 | 0.55 |
| SAMPLE #4 | 25 | 0.56 |
| SAMPLE #5 | 24 | 0.51 |
| SAMPLE #6 | 25 | 0.59 |
| SAMPLE #7 | 24 | 0.52 |
| SAMPLE #8 | 25 | 0.57 |
| SAMPLE #9 | 1 | 1 |
| SAMPLE #10 | 25 | 1 |
| SAMPLE #11 | 1 | 0.45 |

Experimental Example 2: Evaluation of Emission Characteristics of Light-Emitting Elements The emission characteristics of the light-emitting element samples SAMPLE #12 through SAMPLE #21 produced in Production Example 2 were evaluated. The photoluminescence of the light-emitting element samples SAMPLE #12 through SAMPLE #21 was evaluated in the same manner as Experimental Example 1. The intensity of light emitted from each of the light-emitting element samples SAMPLE #12 through SAMPLE #21 was measured, and the results of the measurement were expressed relative to the intensity of light emitted from the light-emitting element sample SAMPLE #19, as shown in Table 4 below.

TABLE 4

| Light-Emitting Element Samples | Intensity of 445 nm light | Intensity of 560 nm Light |
| --- | --- | --- |
| SAMPLE #12 | 25 | 0.42 |
| SAMPLE #13 | 27 | 0.32 |
| SAMPLE #14 | 26 | 0.49 |
| SAMPLE #15 | 25 | 0.51 |
| SAMPLE #16 | 24 | 0.48 |
| SAMPLE #17 | 28 | 0.37 |
| SAMPLE #18 | 24 | 0.32 |
| SAMPLE #19 | 1 | 1 |
| SAMPLE #20 | 27 | 1 |
| SAMPLE #21 | 0.9 | 0.35 |

The light-emitting element samples SAMPLE #1 through SAMPLE #21 produced in Production Examples 1 and 2, which are light-emitting elements 30 each including a first semiconductor layer 31, a light-emitting layer 36, and a second semiconductor layer 32 including nitrogen (N), may generate blue light having a central wavelength of about 445 nm. The 445 nm light measured in Experimental Examples 1 and 2 may be light of a target wavelength range, and the 560 nm light measured in Experimental Examples 1 and 2 may be light of a non-target wavelength rage, which are generated by means of Ga vacancies formed in the semiconductor layers of each of the light-emitting element samples SAMPLE #1 through SAMPLE #21.

Tables 3 and 4 show the intensities of 445 nm light and 560 nm light emitted by each of the light-emitting element samples SAMPLE #1 through #21, relative to the intensities of 445 nm light and 560 nm light emitted by the light-emitting element sample SAMPLE #9 or SAMPLE #19, assuming that the intensities of the 445 nm light and the 560 nm light emitted by the light-emitting element sample SAMPLE #9 or SAMPLE #19 are 1.

Referring to Table 3, the light-emitting element samples SAMPLE #1 through SAMPLE #8, which include a shell layer 39 formed of an inorganic compound, have a 445 nm light intensity of about 25, which means that the light-emitting element samples SAMPLE #1 through SAMPLE #8 generated 445 nm light of a stronger intensity than that of the light-emitting element sample SAMPLE #9. In contrast, the light-emitting element samples SAMPLE #1 through SAMPLE #8 have a 560 nm light intensity of about 0.5, which means that the light-emitting element samples SAMPLE #1 through SAMPLE #8 generated 560 nm light of a weaker intensity than that of the light-emitting element sample SAMPLE #9. The light-emitting element sample SAMPLE #10, which includes only the insulating film 38, has a 445 nm light intensity of 25 and a 560 nm light intensity of 0.45, and that the light-emitting element sample SAMPLE #11, which includes only the shell layer 39, has a 445 nm light intensity of 1 and a 560 nm light intensity of 0.45. For example, the light-emitting element samples including the shell layer 39 formed of an inorganic compound have a strong target light intensity, for example, a strong 445 nm light intensity and a weak 560 nm light intensity, and this shows that the shell layer 39 formed of an inorganic compound may suppress the generation of undesirable 560 nm light by compensating for defects formed in semiconductor layers.

Referring to Table 4, the light-emitting element samples SAMPLE #12 through SAMPLE #18, which include a shell layer 39 formed as a doped region, have a 445 nm light intensity of about 25, which means that the light-emitting element samples SAMPLE #12 through SAMPLE #18 generated 445 nm light of a stronger intensity than that of the light-emitting element sample SAMPLE #19. In contrast, the light-emitting element samples SAMPLE #12 through SAMPLE #18 have a 560 nm light intensity of about 0.5, which means that the light-emitting element samples SAMPLE #12 through SAMPLE #18 generated 560 nm light of a weaker intensity than that of the light-emitting element sample SAMPLE #19. The light-emitting element sample SAMPLE #20, which includes only the insulating film 38, has a 445 nm light intensity of about 27 and a 560 nm light intensity of 1, and the light-emitting element sample SAMPLE #21, which includes only the shell layer 39, has a 445 nm light intensity of about 0.9 and a 560 nm light intensity of about 0.35. For example, the light-emitting element samples including the shell layer 39 formed as a doped region have a strong target light intensity, for example, a strong 445 nm light intensity and a weak 560 nm light intensity, and this shows that the shell layer 39 formed as a doped region may suppress the generation of undesirable 560 nm light by compensating for defects formed in semiconductor layers.

In concluding the detailed description, those skilled in the art will appreciate that many variations and modifications can be made to the disclosed embodiments without substantially departing from the principles of the disclosure. Therefore, the disclosed embodiments of the disclosure are used in a generic and descriptive sense only and not for purposes of limitation.

What is claimed is:

1. A light-emitting element comprising:
a first semiconductor layer doped to have a first polarity;
a second semiconductor layer doped to have a second polarity different from the first polarity;
a light-emitting layer disposed between the first and second semiconductor layers;
a shell layer formed on a side surface of the first semiconductor layer, a side surface of the light-emitting layer, and a side surface of the second semiconductor layer, the shell layer including a divalent metal element; and
an insulating film covering an outer surface of the shell layer and surrounding the side surface of the light-emitting layer, wherein
the shell layer includes at least one of ZnS, ZnSe, MgS, MgSe, ZnMgS, and ZnMgSe.

2. The light-emitting element of claim 1, further comprising:
an electrode layer disposed on the second semiconductor layer,
wherein the insulating film surrounds the light-emitting layer, the second semiconductor layer, and at least part of the outer surface of the electrode layer.

3. The light-emitting element of claim 2, wherein the shell layer is disposed directly on the side surfaces of the first semiconductor layer, the light-emitting layer, and the second semiconductor layer to form a physical interface with at least the first semiconductor layer.

4. The light-emitting element of claim 3, wherein the shell layer has a thickness of about 0.5 nm to about 10 nm.

5. The light-emitting element of claim 2, wherein the insulating film is formed as a single layer or multilayer including one of silicon oxide, silicon nitride, silicon oxynitride, aluminum nitride, aluminum oxide, titanium oxide, zirconium oxide, and hafnium oxide and has a thickness in a range of about 10 nm to about 200 nm.

6. The light-emitting element of claim 5, wherein the insulating film includes:
a first layer which is disposed directly on the shell layer; and
a second layer which is disposed directly on the first layer,
the first layer includes silicon oxide, and
the second layer includes aluminum oxide.

7. The light-emitting element of claim 2, further comprising:
a third semiconductor layer disposed between the first semiconductor layer and the light-emitting layer,
a fourth semiconductor layer disposed between the second semiconductor layer and the light-emitting layer, and
a fifth semiconductor layer disposed between the second and fourth semiconductor layers,
wherein the shell layer is formed on side surfaces of the third, fourth, and fifth semiconductor layers.

8. A light-emitting element comprising:
a first semiconductor layer doped to have a first polarity;
a second semiconductor layer doped to have a second polarity different from the first polarity;
a light-emitting layer disposed between the first and second semiconductor layers;
a shell layer formed on a side surface of the first semiconductor layer, a side surface of the light-emitting layer, and a side surface of the second semiconductor layer, the shell layer including a divalent metal element; and
an insulating film covering an outer surface of the shell layer and surrounding the side surface of the light-emitting layer, wherein
the shell layer forms a region doped with the divalent metal element, on the side surfaces of the first semiconductor layer, the light-emitting layer, and the second semiconductor layer, and
the shell layer is doped with an amount of the divalent metal element in a range of about $10^{10}/cm^3$ to about $10^{18}/cm^3$.

9. The light-emitting element of claim 8, wherein the divalent metal element is one of Be, Mg, Ca, Sr, Ba, Zn, and Cd.

10. The light-emitting element of claim 8, wherein the shell layer has a thickness in a range of about 0.1 Å to about 50 Å.

11. A method of fabricating a light-emitting element, comprising:
forming a plurality of element rods on a target substrate to be spaced apart from each other;
forming shell layers that include a divalent metal element, on a part of outer surfaces of the plurality of element rods and forming insulating films on the shell layers; and
separating the plurality of element rods with the insulating films formed thereon from the target substrate,
wherein the shell layer includes at least one of ZnS, ZnSe, MgS, MgSe, ZnMgS, and ZnMgSe.

12. The method of claim 11, wherein the forming of the plurality of element rods comprises:
forming a semiconductor structure by forming a plurality of semiconductor layers on the target substrate; and
etching the semiconductor structure in a direction perpendicular to a top surface of the target substrate.

13. The method of claim 12, wherein the forming of the shell layers and the insulating films comprises:
forming a shell material layer which surrounds the plurality of element rods, by immersing the target substrate with the plurality of element rods formed thereon in a solution in which a precursor material for forming the shell layers is mixed;

forming an insulating layer on the shell material layer, and forming the shell layers and the insulating films by partially removing the shell material layer and the insulating layer to expose top surfaces of the plurality of element rods.

14. The method of claim 13, wherein the forming of the plurality of element rods includes forming the plurality of element rods, each of the plurality of element rode includes:
  a first semiconductor layer which is doped to have a first polarity;
  a second semiconductor layer which is doped to have a second polarity different from the first polarity; and
  a light-emitting layer which is disposed between the first semiconductor layer and the second semiconductor layer, and the forming of the shell layers includes forming a shell layer on a side surface of the first semiconductor layer, a side surface of the light-emitting layer, and a side surface of the second semiconductor layer.

15. A display device comprising:
a first substrate;
a first electrode disposed on the first substrate;
a second electrode spaced apart from the first electrode;
a first insulating layer disposed on the first substrate and overlapping parts of the first and second electrodes; and
a plurality of light-emitting elements disposed on the first insulating layer, each of the plurality of light-emitting elements including a first end portion disposed on the first electrode and a second end portion disposed on the second electrode, each of the plurality of light-emitting elements including:
  a first semiconductor layer which is doped to have a first polarity;
  a second semiconductor layer which is doped to have a second polarity different from the first polarity;
  a light-emitting layer which is disposed between the first and second semiconductor layers;
  a shell layer which is formed on a side surface of the first semiconductor layer, a side surface of the light-emitting layer, and a side surface of the second semiconductor layer, the shell layer including a divalent metal element; and
  an insulating film which is disposed to cover an outer surface of the shell layer and to surround at least the side surface of the light-emitting layer,
wherein the shell layer includes at least one of ZnS, ZnSe, MgS, MgSe, ZnMgS, and ZnMgSe.

16. The display device of claim 15, further comprising:
a first contact electrode electrically contacting the first electrode and the first end portion of each of the plurality of light-emitting elements; and
a second contact electrode electrically contacting the second electrode and the second end portion of each of the plurality of light-emitting elements.

17. The display device of claim 16, wherein
the shell layer is disposed directly on the side surface of the first semiconductor layer, the side surface of the light-emitting layer, and the side surface of the second semiconductor layer to form a physical interface with at least the first semiconductor layer.

18. The display device of claim 16, wherein the shell layer forms a region doped with the divalent metal element, on the side surface of the first semiconductor layer, the side surface of the light-emitting layer, and the side surface of the second semiconductor layer.

* * * * *